US012804151B2

(12) United States Patent
Unno et al.

(10) Patent No.: US 12,804,151 B2
(45) Date of Patent: *Nov. 17, 2026

(54) IMAGE DECODING DEVICE, IMAGE DECODING METHOD, AND PROGRAM

(71) Applicant: KDDI CORPORATION, Tokyo (JP)

(72) Inventors: Kyohei Unno, Fujimino (JP); Kei Kawamura, Fujimino (JP); Sei Naito, Fujimino (JP)

(73) Assignee: KDDI CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 19/180,881

(22) Filed: Apr. 16, 2025

(65) Prior Publication Data

US 2026/0052250 A1 Feb. 19, 2026

Related U.S. Application Data

(63) Continuation of application No. 17/674,761, filed on Feb. 17, 2022, now Pat. No. 12,301,808, which is a
(Continued)

(30) Foreign Application Priority Data

Dec. 26, 2019 (JP) ................................ 2019-237289

(51) Int. Cl.
*H04N 19/124* (2014.01)
*H04N 19/132* (2014.01)
(Continued)

(52) U.S. Cl.
CPC ......... *H04N 19/124* (2014.11); *H04N 19/132* (2014.11); *H04N 19/176* (2014.11);
(Continued)

(58) Field of Classification Search
CPC .. H04N 19/124; H04N 19/126; H04N 19/132; H04N 19/157; H04N 19/176;
(Continued)

(56) References Cited

U.S. PATENT DOCUMENTS 11,451,780 B2 * 9/2022 Zhu ...................... H04N 19/159
12,101,466 B2 9/2024 Shima et al.
(Continued)

FOREIGN PATENT DOCUMENTS

JP 7054765 B1 4/2022
WO 2021107641 A1 6/2021
(Continued)

OTHER PUBLICATIONS

Bross, Benjamin, et al., "Versatile Video Coding (Draft 7)", Joint Video Experts Team (JVET) of ITU-T SG 16 WP 3 and ISO/IEC JTC 1/SC 29/WG 11, JVET-P2001 (version 14), Meeting: Geneva, CH Oct. 1-11, 2019, pp. 297-299, Sealing process for transform coefficients.
(Continued)

*Primary Examiner* — Behrooz M Senfi
(74) *Attorney, Agent, or Firm* — Troutman Pepper Locke LLP

(57) ABSTRACT

An image decoding device includes a quantization parameter deriving unit configured to correct a value of a decoded quantization parameter of a target block depending on whether or not adaptive color transform has been applied to the target block, and then set, as the quantization parameter of the target block, the larger of the corrected value of the quantization parameter and a predetermined value of "0" or more.

3 Claims, 17 Drawing Sheets

Related U.S. Application Data continuation of application No. PCT/JP2020/045160, filed on Dec. 4, 2020.

(51) Int. Cl.

| | |
|---|---|
| ***H04N 19/176*** | (2014.01) |
| ***H10F 10/144*** | (2025.01) |
| ***H10F 19/30*** | (2025.01) |
| ***H10F 19/80*** | (2025.01) |
| ***H10F 19/90*** | (2025.01) |
| ***H10F 71/00*** | (2025.01) |
| ***H10F 77/124*** | (2025.01) |
| ***H10F 77/20*** | (2025.01) |

(52) U.S. Cl.

CPC ........... *H10F 10/144* (2025.01); *H10F 19/30* (2025.01); *H10F 19/80* (2025.01); *H10F 19/906* (2025.01); *H10F 19/908* (2025.01); *H10F 71/00* (2025.01); *H10F 77/124* (2025.01); *H10F 77/211* (2025.01); *H10F 77/215* (2025.01); *Y02E 10/544* (2013.01); *Y02P 70/50* (2015.11)

(58) Field of Classification Search

CPC .... H04N 19/186; H04N 19/70; H10F 10/144; H10F 19/30; H10F 19/80; H10F 19/906; H10F 19/908; H10F 71/00; H10F 77/124; H10F 77/211; H10F 77/215

USPC ..................................................... 375/240.03

See application file for complete search history.

(56) References Cited

U.S. PATENT DOCUMENTS

| | | | | |
|---|---|---|---|---|
| 12,301,808 | B2 * | 5/2025 | Unno | H04N 19/124 |
| 12,375,642 | B2 | 7/2025 | Shima et al. | |
| 12,519,944 | B2 | 1/2026 | Yoo et al. | |
| 2014/0376611 | A1 | 12/2014 | Kim et al. | |
| 2016/0100167 | A1 | 4/2016 | Rapaka et al. | |
| 2016/0100168 | A1 | 4/2016 | Rapaka et al. | |
| 2022/0210419 | A1 | 6/2022 | Zhu et al. | |
| 2022/0232203 | A1 | 7/2022 | Hsiang | |
| 2022/0248006 | A1 | 8/2022 | Lim et al. | |
| 2022/0286701 | A1 | 9/2022 | Zhao et al. | |
| 2022/0303567 | A1 | 9/2022 | Jung et al. | |
| 2023/0007265 | A1 | 1/2023 | Tsukuba | |
| 2025/0247536 | A1 * | 7/2025 | Unno | H04N 19/124 |
| 2026/0039824 | A1 * | 2/2026 | Unno | H04N 19/124 |
| 2026/0052797 | A1 * | 2/2026 | Unno | H04N 19/124 |

FOREIGN PATENT DOCUMENTS

| | | | |
|---|---|---|---|
| WO | 2021117500 | A1 | 6/2021 |
| WO | 2021125309 | A1 | 6/2021 |

OTHER PUBLICATIONS

Nguyen, Tung et al., "Non-CE8: Minimum Allowed QP for Transform SKIP Mode", Joint Video Experts Team (JVET) of ITU-T SG 16 WP 3 and ISO/IEC JTC 1/SC 29/WG 11, JVET-00405-v1, 15th Meeting: Gothenburg, SE, Jun. 3-12, 2019, pp. 1-4 Sealing process for transform coefficients.

Zhao, Jie et al., "Non-CE8: Minimum QP for Palette Escape Coding", Joint Video Experts Team (JVET) of ITU-T SG 16 WP 3 and ISO/IEC JTC 1/SC 29/WG 11, JVET-P0460, 16th Meeting: Geneva, CH, Oct. 2019, pp. 1-4 1 Introduction, 2 Proposed.

Tsukuba, Takeshi et al., "On QP Adjustment for Adaptive Color Transform", Joint Video Experts Team (JVET) of ITU-T SG 16 WP 3 and ISO/IEC JTC 1/SC 29 WG 11, JVET-Q0098-v4, 17th Meeting: Brussels, BE, Jan. 7-17, 2020, pp. 1-7 2 Proposal, 7 spec changes.

Unno, Kyohei et al., "Clipping of Minimum QP prime value", Joint Video Experts Team (JVET) of ITU-T SG 16 WP 3 and ISO/IEC JTC 1/SC 29/WG 11, JVET-Q0142, 17th Meeting: Brussels, BE, Jan. 7-17, 2020, pp. 1-3 2 Proposed Method.

Jung, Jaehong et al., "On QP adjustment in adaptive color transform", Joint Video Experts Team (JVET) of ITU-T SG 16 WP 3 and ISO/IEC JTC 1/SC 29/WG 11, JVET-Q0241-v3, 17th Meeting: Brussels, BE, Jan. 7-17, 2020, pp. 1-5 2 Proposed method.

International Search Report issued in corresponding International Patent Application No. PCT/JP2020/045160 dated Feb. 16, 2021.

Xiu, Xiaoyu et al., "Support of adaptive color transform for 444 video coding in VVC", Joint Video Experts Team (JVET) of ITU-T SG 16 WP 3 and ISO/IEC JTC 1/SC 29/WG 11 16th Meeting: Geneva, CH, Oct. 1-11, 2019, JVET-P0517, pp. 1-5.

Japanese office action dated May 24, 2022 Japanese patent application No. 2022-062615.

Extended European Search Report dated May 22, 2023, from corresponding European Application No. 20907984.7.

Karczewicz (Qualcomm) M et al: "Non-CE8: Minimum QP for Transform Skip Mode", 15. JVET Meeting; Jul. 3, 2019-Jul. 12, 2019; Gothenburg; (The Joint Video Exploration Team of ISO/IEC JTC1/SC29/WG11 and ITU-T SG.16 ), No. JVET-O0919 Jul. 11, 2019 (Jul. 11, 2019), XP030220544.

Unno (KDDI-Research) K et al: "Non-CE4: An applying condition of BDOF", 16. JVET Meeting; Oct. 1, 2019-Oct. 11, 2019; Geneva; (The Joint Video Exploration Team of ISO/IEC JTC1/SC29/WG11 and ITU-T SG.16), No. JVET-P0546; m50517 Sep. 27, 2019 (Sep. 27, 2019), XP030217649.

Exam Report dated Jul. 11, 2025, from corresponding European Application No. 20907984.7.

Rapaka K et al: "Qp derivation for adaptive color transform", 19. JCT-VC Meeting; Oct. 17, 2014-Oct. 24, 2014; Strasbourg; (Joint Collaborative Team on Video Goding of ISO/IEC JTC1/SC29/WG11 and ITU-T SG.16 ); URL: http://wftp3.itu.int/av-arch/jctvc-site/, No. JCTVC-S0144, Oct. 8, 2014 (Oct. 8, 2014), XP030116913.

Non-Final Office Action issued in corresponding U.S. Appl. No. 19/180,728, dated May 28, 2026.

Non-Final Office Action issued in corresponding U.S. Appl. No. 19/180,821, dated Jun. 3, 2026.

Non-Final Office Action issued in corresponding U.S. Appl. No. 19/180,931, dated Jun. 16, 2026.

* cited by examiner

FIG. 10

| CONDITION | BOUNDARY STRENGTH |
|---|---|
| AT LEAST ONE OF BLOCKS ON BOTH SIDES OF BOUNDARY IS LOSSLESS BLOCK | 0 |
| BOUNDARY IS SUB-BLOCK BOUNDARY, AFFINE MOTION COMPENSATION PREDICTION IS APPLIED TO CU, AND PROF IS ENABLED | 0 |
| AT LEAST ONE OF BLOCKS ON BOTH SIDES OF BOUNDARY IS INTRA PREDICTION BLOCK | 2 |
| NON-ZERO TRANSFORM COEFFICIENT IS PRESENT IN AT LEAST ONE OF BLOCKS ON BOTH SIDES OF BOUNDARY, AND BOUNDARY IS TU BOUNDARY | 1 |
| ABSOLUTE VALUE OF DIFFERENCE BETWEEN MOTION VECTORS OF BLOCKS ON BOTH SIDES OF BOUNDARY IS EQUAL TO OR MORE THAN 1/2 PIXEL | 1 |
| REFERENCE IMAGE OR NUMBER OF MOTION VECTORS IS DIFFERENT BETWEEN BLOCKS ON BOTH SIDES OF BOUNDARY | 1 |
| BOUNDARY IS CU BOUNDARY, AND AT LEAST ONE OF BLOCKS ON BOTH SIDES OF BOUNDARY IS TPM BLOCK | 1 |
| BOUNDARY IS CU BOUNDARY, AND AT LEAST ONE OF BLOCKS ON BOTH SIDES OF BOUNDARY IS GEO BLOCK | 1 |
| OTHERS | 0 |

FIG. 15

```
Val=c0*P[y+offset1][x]
    +c1*P[y][x-1]+c2*P[y][x]+c3*P[y][x+1]
    +c4*P[y+offset2][x-1]+c5*P[y+offset2][x]+c6*P[y+offset2][x+1]
    +c7*P[y+offset3][x]
```

| POSITION | offset1 | offset2 | offset3 |
|---|---|---|---|
| (a) | -1 | 1 | 1 |
| (b) | 0 | 0 | 0 |
| (c) | 0 | 0 | 0 |
| (d) | -1 | 1 | 1 |
| (e) | -1 | 1 | 2 |

IMAGE DECODING DEVICE, IMAGE DECODING METHOD, AND PROGRAM

CROSS-REFERENCE TO RELATED APPLICATIONS

The present application is a continuation based on U.S. application Ser. No. 17/674,761, filed Feb. 17, 2022, which is a continuation of PCT Application No. PCT/JP2020/045160, filed on Dec. 4, 2020, which claims the benefit of Japanese patent application No. 2019-237289, filed on Dec. 26, 2019. The content of all of which are incorporated by reference herein in their entirety.

TECHNICAL FIELD

The present invention relates to an image decoding device, an image decoding method, and a program.

BACKGROUND

Versatile Video Coding (Draft 7), JVET-N 1001 discloses a method for decoding a quantization parameter used in inverse quantization.

SUMMARY

However, the inventor of the present application found a problem wherein a value of the decoded quantization parameter may be negative in the Versatile Video Coding (Draft 7), JVET-N 1001.

The present invention has been made in view of the above-described problems, and an object of the present invention is to provide an image decoding device, an image decoding method, and a program capable of ensuring that a value of the decoded quantization parameter always be "0" or more.

The first aspect of the present invention is summarized as an image decoding device including: a quantization parameter deriving unit configured to correct a value of a decoded quantization parameter of a target block depending on whether or not adaptive color transform has been applied to the target block, and then set, as the quantization parameter of the target block, the larger of the corrected value of the quantization parameter and a predetermined value of "0" or more The second aspect of the present invention is summarized as an image decoding method including: correcting a value of a decoded quantization parameter of a target block depending on whether or not adaptive color transform has been applied to the target block, and then setting, as the quantization parameter of the target block, the larger of the corrected value of the quantization parameter and a predetermined value of "0" or more.

The third aspect of the present invention is summarized as a program used in an image decoding device, the program causing a computer to perform: correcting a value of a decoded quantization parameter of a target block depending on whether or not adaptive color transform has been applied to the target block, and then setting, as the quantization parameter of the target block, the larger of the corrected value of the quantization parameter and a predetermined value of "0" or more.

ADVANTAGEOUS EFFECTS OF INVENTION

According to the present invention, it is possible to provide an image decoding device, an image decoding method, and a program capable of ensuring that a value of the decoded quantization parameter always be "0" or more.

BRIEF DESCRIPTION OF DRAWINGS

FIG. 10 is a diagram for describing an example of a method for determining a boundary strength by a boundary strength determination unit 253A/253B of the deblocking filter unit 250A of the in-loop filter processing unit 250 of the image decoding device 200 according to the embodiment.

FIG. 15 is a diagram illustrating an example of filtering processing in the Cb CC-ALF unit 257A of the adaptive loop filter unit 250C of the in-loop filter processing unit 250 of the image decoding device 200 according to the embodiment and processing at the boundary portion.

DESCRIPTION OF EMBODIMENTS

An embodiment of the present invention will be explained hereinbelow with reference to the drawings. Note that the constituent elements of the embodiment below can, where appropriate, be substituted with existing constituent elements and the like, and that a wide range of variations, including combinations with other existing constituent elements, is possible. Therefore, there are no limitations placed on the content of the invention as in the claims on the basis of the disclosures of the embodiment hereinbelow.

Figure 1:
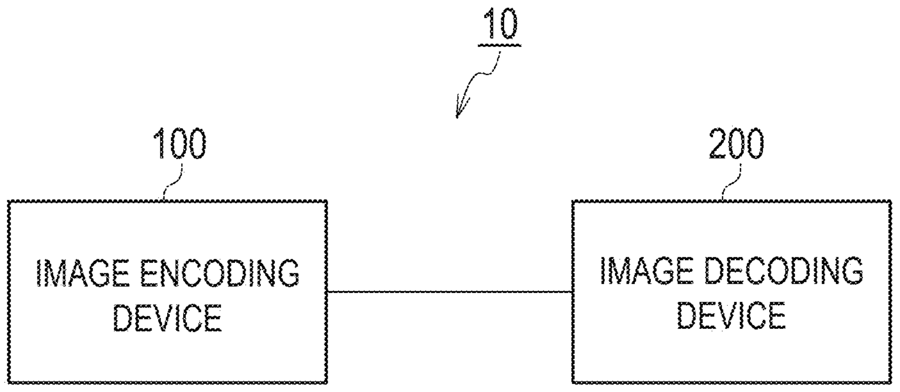
FIG. 1 is a diagram illustrating an example of a configuration of an image processing system 10 according to an embodiment.

An image processing system 10 according to a first embodiment of the present invention is explained below with reference to FIG. 1 to FIG. 17. FIG. 1 is a diagram illustrating the image processing system 10 according to an embodiment according to this embodiment.

As illustrated in FIG. 1, the image processing system 10 includes an image encoding device 100 and an image decoding device 200.

The image encoding device 100 is configured to encode an input image signal to thereby generate encoded data. The image decoding device 200 is configured to decode the encoded data to generate an output image signal.

Such encoded data may be transmitted from the image encoding device 100 to the image decoding device 200 via a transmission line. The encoded data may be stored in a storage medium and then provided from the image encoding device 100 to the image decoding device 200.

Hereinafter, the image decoding device 200 according to the present embodiment will be described with reference to FIG. 2. FIG. 2214 is a diagram illustrating an example of functional blocks of the image decoding device 200 according to the present embodiment.

Figure 2:
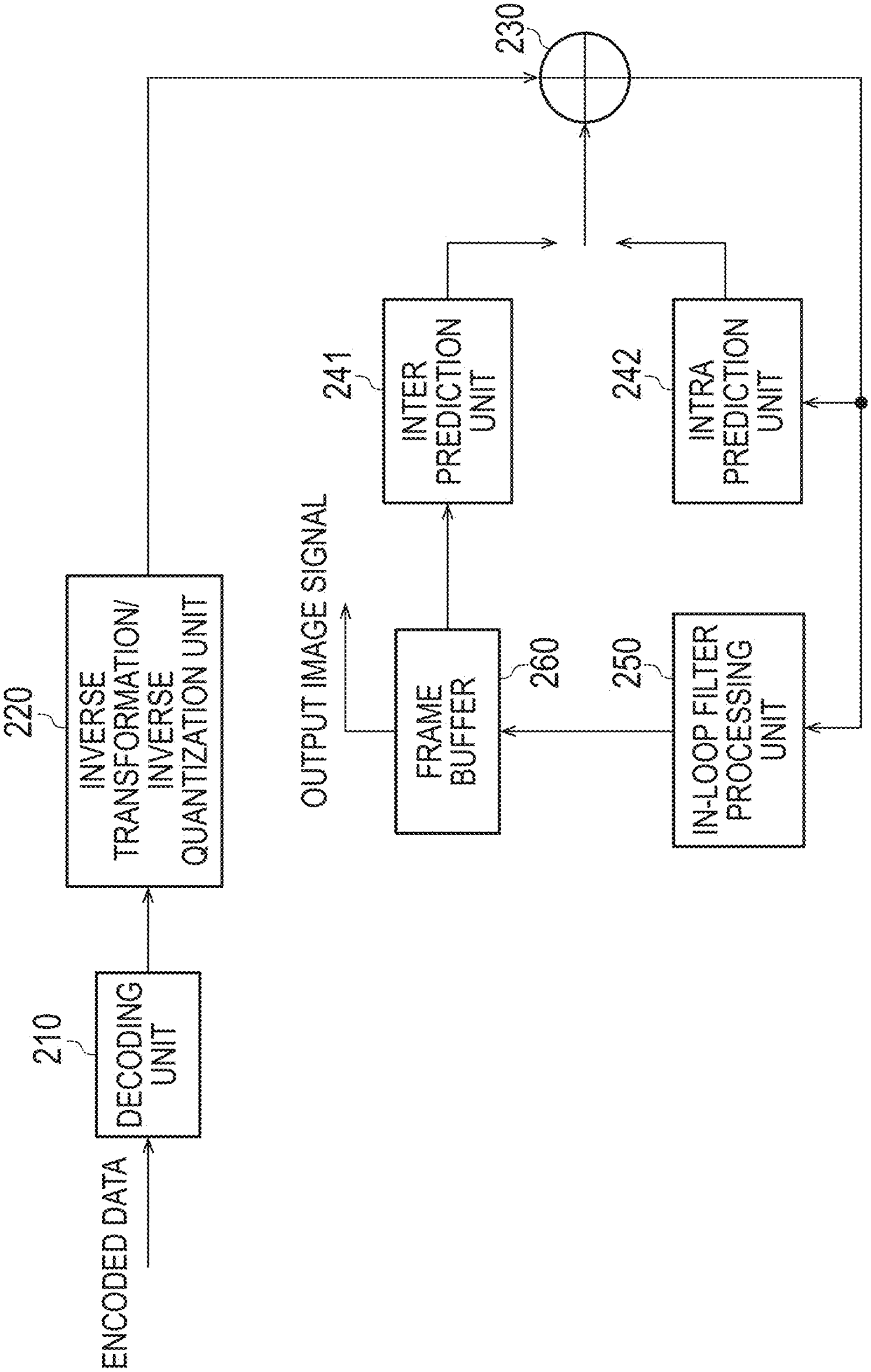
FIG. 2 is a diagram illustrating an example of functional blocks of an image decoding device 200 according to the embodiment.

As illustrated in FIG. 2, the image decoding device 200 includes a decoding unit 210, an inverse transformation/inverse quantization unit 220, an adder 230, an inter-prediction unit 241, an intra-prediction unit 242, an in-loop filter processing unit 250, and a frame buffer 260.

The decoding unit 210 is configured to decode the encoded data generated by the image encoding device 100 and decode a coefficient level value.

Here, for example, the decoding is entropy decoding with a procedure opposite to a procedure of entropy encoding performed by the encoding unit 140.

Further, the decoding unit 210 may be configured to acquire the control data by decoding processing of the encoded data.

As described above, the control data may include size data such as a size of the encoded block (CU: Coding Unit), a size of the prediction block (PU: Prediction Unit), and a size of the transformation block (TU: Transform block).

The inverse transformation/inverse quantization unit 220 is configured to perform inverse transformation processing of the coefficient level value which is output from the decoding unit 210. Here, the inverse transformation/inverse quantization unit 220 may be configured to perform inverse quantization of the coefficient level value prior to the inverse transformation processing.

Furthermore, the inverse transformation/inverse quantization unit 220 may be configured to decode a quantization parameter (QP), which is a parameter defining a quantization step size used at the time of inverse quantization, for each block as described later.

Furthermore, the inverse transformation/inverse quantization unit 220 may be configured not to perform the inverse transformation processing in a block to which a transform skip mode as described later is applied.

The adder 230 is configured to generate a decoded signal before filter processing by adding the prediction signal to a prediction residual signal which is output from the inverse transformation/inverse quantization unit 220, and output the decoded signal before filter processing to the intra-prediction unit 242 and the in-loop filter processing unit 250.

Here, the decoded signal before filter processing is included in the reference block to be used by the intra-prediction unit 242.

The inter-prediction unit 241 is configured to generate a prediction signal by inter-prediction (prediction between the frames).

Specifically, the inter-prediction unit 241 is configured to generate a prediction signal for each prediction block based on a motion vector decoded from the encoded data and a reference signal included in the reference frame. The inter-prediction unit 241 is configured to output the prediction signal to the adder 230.

Here, the inter prediction unit 241 may have a plurality of modes as a specific inter prediction method. For example, the inter prediction unit 241 may have a triangle partition mode (TPM) or a geometrical partitioning (GEO) mode to be described later.

The intra-prediction unit 242 is configured to generate a prediction signal by intra-prediction (prediction in the frame).

Specifically, the intra-prediction unit 242 is configured to specify a reference block included in the target frame and generate a prediction signal for each prediction block based on the specified reference block. The intra-prediction unit 242 is configured to output the prediction signal to the adder 230.

The in-loop filter processing unit 250 is configured to perform filter processing on the decoded signal before filter processing that is output from the adder 230 and output the decoded signal after filter processing to the frame buffer 260.

Here, the in-loop filter processing may be implemented by a plurality of filter processing sets. For example, the filter processing is deblocking filter processing of reducing distortion occurring at a boundary portion of a block (an encoding block, a prediction block, a transformation block, or a sub-block obtained by dividing each of the encoding block, the prediction block, and the transformation block), or adaptive loop filter processing of switching a filter based on a filter coefficient or filter selection information transmitted from the image encoding device 100, a local property of a design of an image, or the like.

The frame buffer 260 is configured to accumulate the reference frames to be used by the inter-prediction unit 241.

Here, the decoded signal after filter processing is included in the reference frame to be used by the inter-prediction unit 241.

(Inverse Transformation/Inverse Quantization Unit 220)

Figure 3:
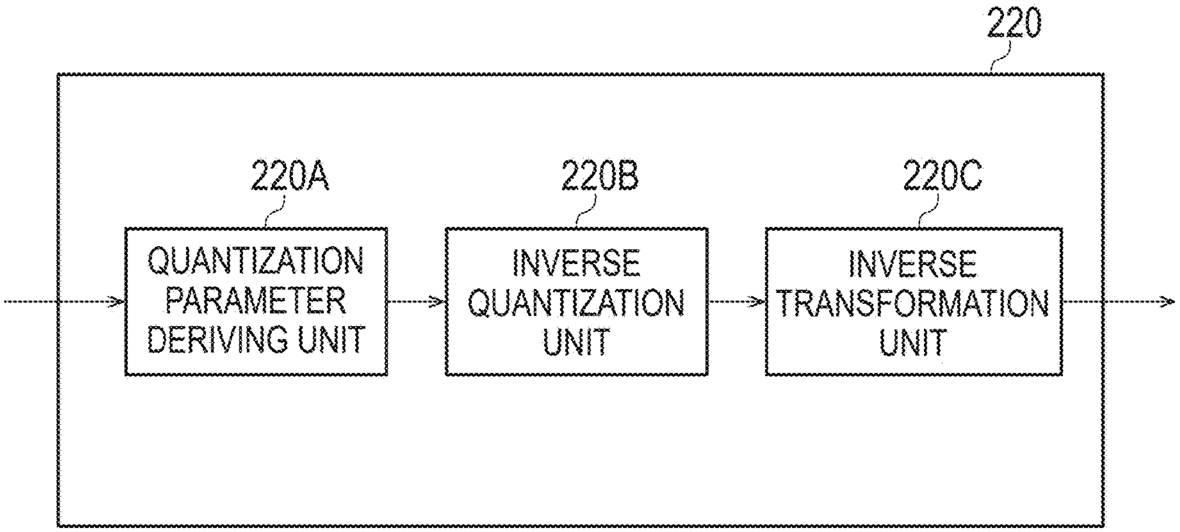
FIG. 3 is a diagram illustrating an example of functional blocks of an inverse transformation/inverse quantization unit 220 of the image decoding device 200 according to the embodiment.

Hereinafter, the inverse transformation/inverse quantization unit 220 according to the present embodiment will be described with reference to FIG. 3. FIG. 3 is a diagram illustrating an example of functional blocks of the inverse transformation/inverse quantization unit 220 of the image decoding device 200 according to the present embodiment.

As illustrated in FIG. 3, the inverse transformation/inverse quantization unit 220 includes a quantization parameter deriving unit 220A, an inverse quantization unit 220B, and an inverse transformation unit 220C.

The quantization parameter deriving unit 220A is configured to decode the quantization parameter for each block by using the control data as an input and output the decoded quantization parameter to the inverse quantization unit 220B.

Specifically, the quantization parameter deriving unit 220A is configured to correct a value of a decoded quantization parameter of a target block depending on whether or not adaptive color transform has been applied to the target block, and then set, as the quantization parameter of the target block, the larger of the corrected value of the quantization parameter and a predetermined value of “0” or more.

For example, the quantization parameter deriving unit 220A may be configured to correct the value of the decoded quantization parameter of the target block depending on whether or not the adaptive color transform has been applied to the target block, and then set, as the quantization parameter of the target block, the larger of the corrected value of the quantization parameter and “0”.

Alternatively, the quantization parameter deriving unit 220A may be configured to correct the value of the decoded quantization parameter of the target block depending on whether or not the adaptive color transform has been applied to the target block, and then set, as the quantization parameter of the target block, the larger of the corrected value of the quantization parameter and “0”, in a case where the transform skip mode has not been applied to the target block.

Alternatively, the quantization parameter deriving unit 220A may be configured to set the value of the quantization parameter of the target block to be equal to or more than a minimum value of the quantization parameter at the time of applying the transform skip mode regardless of whether or not the adaptive color transform has been applied to the target block, in a case where the transform skip mode has been applied to the target block.

Alternatively, the quantization parameter deriving unit 220A may be configured to correct the value of the decoded quantization parameter depending on whether or not the adaptive color transform has been applied to the target block, and then set, as the quantization parameter of the target block, the larger of the corrected value of the quantization parameter and the minimum value of the quantization parameter at the time of applying the transform skip mode, in a case where the transform skip mode has been applied to the target block.

Alternatively, the quantization parameter deriving unit 220A may be configured to set the value of the quantization parameter of the target block to be “4” or more regardless of whether or not the adaptive color transform has been applied to the target block, in a case where the transform skip mode has been applied to the target block.

Alternatively, the quantization parameter deriving unit 220A may be configured to correct the value of the decoded quantization parameter of the target block depending on whether or not the adaptive color transform has been applied to the target block, and then set, as the quantization parameter of the target block, the larger of the corrected value of the quantization parameter and “4”, in a case where the transform skip mode has been applied to the target block.

An example of specific processing contents of the quantization parameter deriving unit 220A will be described later.

The inverse quantization unit 220B is configured to perform inverse quantization processing by using the quantization parameter and the coefficient level value output from the decoding unit 210 as inputs, and output the coefficient level value after the inverse quantization. Since a known method can be used for the specific processing performed by the inverse quantization unit 220B, a description thereof will be omitted.

The inverse transformation unit 220C is configured to perform inverse transformation processing by using the coefficient level value after the inverse quantization processing output by the inverse quantization unit 220B as an input and output a remainder signal. Note that, since a known method can be used for the specific processing performed by the inverse transformation unit 220C, a description thereof will be omitted.

Note that, in a case where the transform skip mode has been applied to the corresponding block, the processing performed by the inverse transformation unit 220C does not have to be performed, and the output of the inverse quantization unit 220B may be used as the output of the inverse transformation/inverse quantization unit 220. Whether or not the transform skip has been applied to the corresponding block can be determined, for example, by checking a value of transform_skip_flag in Versatile Video Coding (Draft 7), JVET-N 1001.

Figure 4:
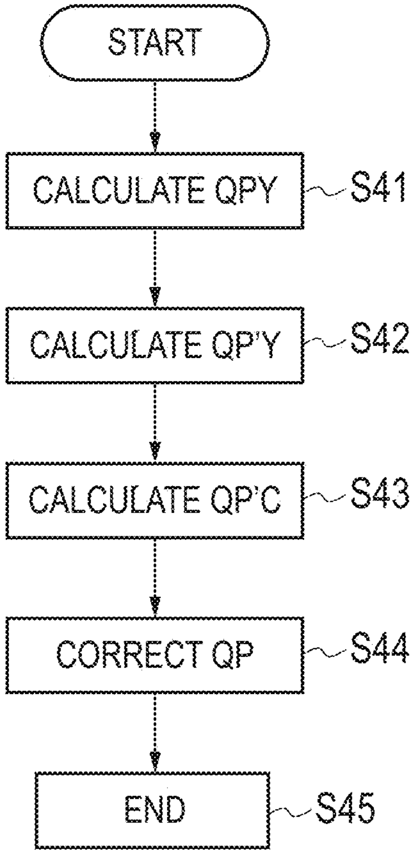
FIG. 4 is a flowchart illustrating an example of a processing flow of a quantization parameter deriving unit 220A of the inverse transformation/inverse quantization unit 220 of the image decoding device 200 according to the embodiment.

FIG. 4 is a flowchart illustrating an example of a processing flow of the quantization parameter deriving unit 220A. Hereinafter, an example of processing performed by the quantization parameter deriving unit 220A according to the present embodiment will be described with reference to FIG. 4.

As illustrated in FIG. 4, in Step S41, the quantization parameter deriving unit 220A derives a value of a variable QpY. For example, QpY can be calculated by the following equation, similarly to Versatile Video Coding (Draft 7), JVET-N 1001.

$$QpY = ((qP_{Y\_PRED} + CuQpDeltaVal + 64 + 2 \times QpBdOffset)\%(64 + QpBdOffset)) - QpBdOffset \quad \text{(Equation 1)}$$

Here, $qP_{Y\_PRED}$ is a prediction value calculated from surrounding blocks. Further, CuQpDeltaVal is a value indicating a difference between QpY of an adjacent block and QpY of the target block, and is obtained by decoding a value transmitted from the image encoding device 100 by the decoding unit 210. QpBdOffset is a positive value set according to an internal bit depth of a pixel value.

As a specific method for calculating these variables, for example, the method described in Versatile Video Coding (Draft 7), JVET-N 1001 can be used.

“+64+2×QpBdOffset” in (Equation 1) described above is added to ensure that a part before an operator % is “0” or more, and a minimum value of QpY calculated in (Equation 1) is “-QpBdOffset”.

In Step S42, the quantization parameter deriving unit 220A calculates Qp'Y which is a quantization parameter value of a luma signal. For example, similarly to Versatile Video Coding (Draft 7), JVET-N 1001, the quantization parameter deriving unit 220A can calculate Qp'Y by the following (Equation 2).

$$Qp'Y = QpY + QpBdOffset \quad \text{(Equation 2)}$$

Here, since the minimum value of QpY is "-QpBdOffset" as described above, a minimum value of Qp'Y is "0".

In Step S43, the quantization parameter deriving unit 220A calculates Qp'Cb, Qp'Cr, and Cp'CbCr which are quantization parameter values of a chroma signal.

Note that, in practice, the quantization parameters Qp'Cb, Qp'Cr, and Cp'CbCr are defined for cases of using functions including a Cb signal, a Cr signal, and joint chroma coding, respectively. However, since calculation methods therefor are basically the same, only the calculation method for the parameter Qp'Cb will be collectively described below, and a description of the calculation methods for the other two will be omitted.

For example, similarly to Versatile Video Coding (Draft 7), JVET-N 1001, the quantization parameter deriving unit 220A can calculate Qp'Cb by the following (Equation 3).

$$Qp'Cb = \text{Clip3}(-QpBdOffset, 63, qPcb + \text{pps\_cb\_qp\_offset} + \text{slice\_cb\_qp\_offset} + CuQpOffsetCb) + QpBdOffset \quad \text{(Equation 3)}$$

Here, qPcb is a parameter calculated using QpY described above. pps_cb_qp_offset is a value specified by a picture parameter set (PPS). slice_cb_qp_offset is a value specified by a slice header. CuQpOffsetCb is obtained by decoding a value transmitted from the image encoding device 100 by the decoding unit 210.

As a specific method for calculating these parameters, for example, the method described in Versatile Video Coding (Draft 7), JVET-N 1001 can be used.

"Clip3(min,max,val)" in (Equation 3) described above is a function that returns, in a case where a value of the variable val is smaller than the variable min, a value of "min", returns, in a case where the value of the variable val is larger than the variable max, a value of "max", and returns the value of "val" as it is otherwise. Therefore, a minimum value of the first term on the right side of (Equation 3) is "-QpBdOffset", and "QpBdOffset" is added to the value of the first term on the right side of (Equation 3) in the second term on the right side of (Equation 3), and thus, a minimum value of Qp'Cb is "0".

Note that the method for deriving Qp'Y, Qp'Cb, Qp'Cr, and Cp'CbCr described above is merely an example. The derivation may be performed by a method other than the above as long as the minimum value of each value is "0".

In Step S44, the quantization parameter deriving unit 220A corrects the quantization parameter Qp'Y of the luma signal calculated as described above and the quantization parameters Qp'Cb, Qp'Cr, and Cp'CbCr of the chroma signal as follows.

First, a variable qP for which each of Qp'Y, Qp'Cb, Qp'Cr, and Cp'CbCr is substituted is described.

In a case where the transform skip has not been applied to a color signal (Y, Cb, Cr, or CbCr) of the target block (for example, in a case where a value of transform_skip_flag is "0"), the quantization parameter deriving unit 220A performs correction as illustrated in (Equation 4) and (Equation 5) below.

$$qP = qP - (\text{cu\_act\_enabled\_flag}\,?\,\text{offset}: 0) \quad \text{(Equation 4)}$$

$$qP = \text{Max}(0, qP) \quad \text{(Equation 5)}$$

Here, cu_act_enabled_flag is a flag indicating whether or not adaptive color transform (ACT) has been applied to the target block, and offset is a positive integer. Further, Max (a,b) is a function that returns the same value as the larger of the two variables a and b.

Furthermore, in a case where the transform skip has been applied to the target block (for example, in a case where the value of transform_skip_flag is "1"), the quantization parameter deriving unit 220A performs correction as illustrated in the following (Equation 6).

$$qP = \text{Max}(QpPrimeTsMin, qP - (\text{cu\_act\_enabled\_flag}\,?\,\text{offset}: 0)) \quad \text{(Equation 6)}$$

Here, QpPrimeTsMin is a variable that defines the minimum value of the quantization parameter in the block to which the transform skip is applied.

Furthermore, in a case where the transform skip has been applied to the target block (for example, in a case where the value of transform_skip_flag is "1"), the quantization parameter deriving unit 220A may perform correction as illustrated in the following (Equation 7) and (Equation 8).

$$qP = \text{Max}(QpPrimeTsMin, qP) - (\text{cu\_act\_enabled\_flag}\,?\,\text{offset}: 0)) \quad \text{(Equation 7)}$$

$$qP = \text{Max}(4, qP) \quad \text{(Equation 8)}$$

Furthermore, the quantization parameter deriving unit 220A may switch a value of the variable offset of (Equation 4), (Equation 6), and (Equation 7) for each color signal.

For example, the quantization parameter deriving unit 220A can set "offset=5" in a case of the Y signal and the Cb signal (corresponding to a Cg signal when the ACT is applied) (for example, a case where a value of cIdx in Versatile Video Coding (Draft 7), JVET-N 1001 is "0" or "1"), and can set "offset=3" in a case of the Cr signal (corresponding to a Co signal when the ACT is applied) (for example, a case where the value of cIdx in Versatile Video Coding (Draft 7), JVET-N 1001 is "2").

It is possible to ensure that the value of the quantization parameter becomes "0" or more for all the blocks by correcting the value of the quantization parameter as described above.

Furthermore, in a case where the transform skip mode is applied to the target block, for example, it is possible to ensure that the value of the quantization parameter is "QpPrimeTsMin" or more by performing correction as in (Equation 6) described above.

With such a configuration, the minimum value of the quantization parameter in the block to which transform skip has been applied can be the same regardless of suitability of the adaptive color transform.

Furthermore, in a case where the transform skip is applied to the target block, for example, it is possible to ensure that the value of the quantization parameter is "4" or more by performing correction as in (Equation 7) and (Equation 8) described above. In a case where of "QP=4" when the transform skip mode is applied, a quantization step width becomes "1", and lossless decoding becomes possible. Therefore, with such a configuration, it is possible to prevent the value of the quantization parameter from becoming unnecessarily small.

Furthermore, the quantization parameter correction processing described as Step S45 can also be performed as shown in (Equation 9) and (Equation 10) below in Steps S42 and S43, respectively.

$$Qp'Y = \text{Max}(\text{Min}Val, QpY + QpBdOffset - (\text{cu\_act\_enabled\_flag}?\text{offset}: 0)) \quad \text{(Equation 6)}$$

$$Qp'Cb = \text{Clip3}(-QpBdOffset + \text{Min}Val, 63, qPcb + \text{pps\_cb\_qp\_offset} + \text{slice\_cb\_qp\_offset} + CuQpOffsetCb) + QpBdOffset \quad \text{(Equation 10)}$$

Here, MinVal is "0" in a case where the transform skip is not applied to the target block, and is "QpPrimeTsMin" in a case where the transform skip is applied to the target block.

With the above configuration, it is possible to ensure that the value of the quantization parameter is always "0" or more, regardless of the suitability of the adaptive color transform. For example, in Versatile Video Coding (Draft 7), JVET-N 1001, remainder calculation is performed using the value of the quantization parameter, and the dividend is required to be "0" or more, so that stability of calculation can be secured.

Furthermore, with the above configuration, it is possible to ensure that the quantization parameter value is "QpPrimeTsMin" or more in the block to which transform skip is applied, regardless of the suitability of the adaptive color transform.

When the transform skip is applied, in a case where "QP=4", the quantization step width becomes "1", and lossless decoding becomes possible. Therefore, when the above-described processing is performed after defining that "QpPrimeTsMin=4", it is possible to prevent the quantization parameter from becoming unnecessarily small in the block to which the transform skip is applied.

As described above, the quantization parameter value corresponding to each color signal can be calculated for each block.

Figure 5:
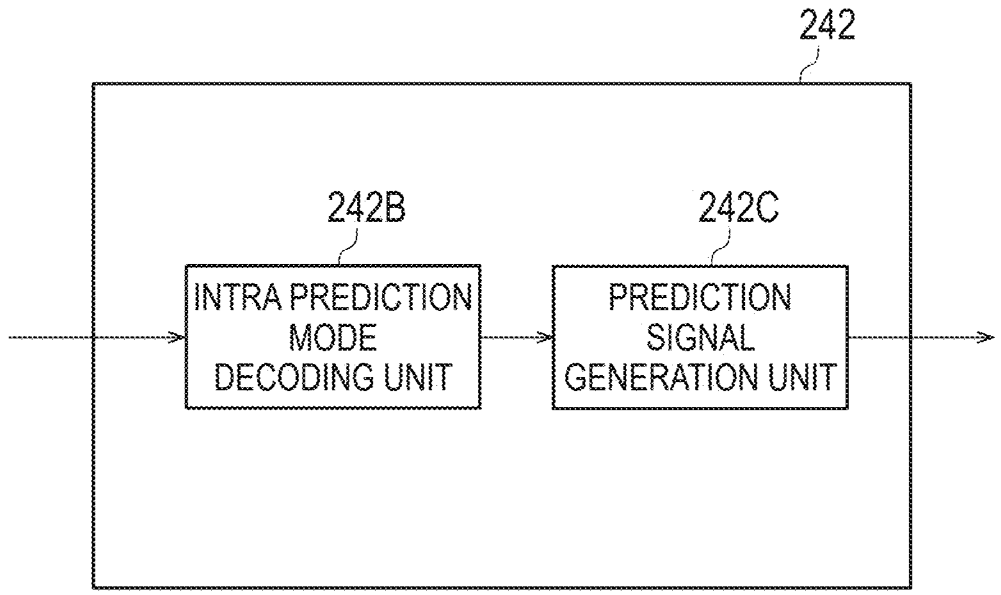
FIG. 5 is a diagram illustrating an example of functional blocks of an intra prediction unit 240 of the image decoding device 200 according to the embodiment.

Hereinafter, the intra prediction unit 242 according to the present embodiment will be described with reference to FIG. 5. FIG. 5 is a diagram illustrating an example of functional blocks of the intra prediction unit 242 of the image decoding device 200 according to the present embodiment.

As illustrated in FIG. 5, the intra prediction unit 242 includes an intra prediction mode decoding unit 242B and a prediction signal generation unit 242C.

The intra prediction unit 242 is an example of a prediction unit configured to generate the prediction signal through intra prediction (intra-frame prediction).

The intra prediction mode decoding unit 242B is configured to decode information necessary for performing the intra prediction for each block.

Figure 6:
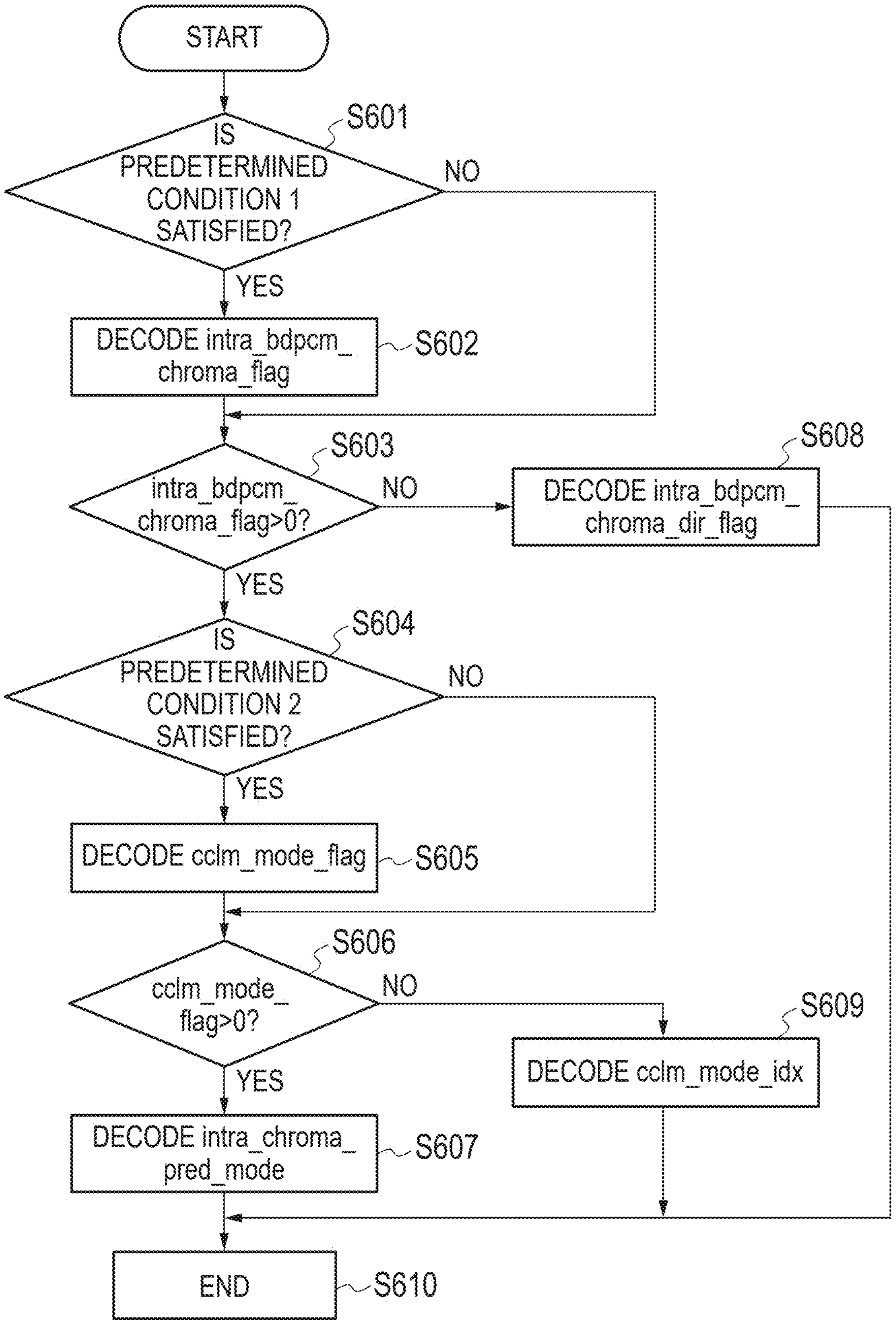
FIG. 6 is a flowchart illustrating an example of a decoding processing flow of an intra prediction mode of a chroma signal by an intra prediction mode decoding unit 242B of the intra prediction unit 240 of the image decoding device 200 according to the embodiment.

FIG. 6 is a flowchart illustrating an example of a flow of decoding processing of an intra prediction mode of the chroma signal by the intra prediction mode decoding unit 242B. Hereinafter, an example of the flow of the decoding processing of the intra prediction mode of the chroma signal by the intra prediction mode decoding unit 242B will be described with reference to FIG. 6.

In Step S601, the intra prediction mode decoding unit 242B determines whether or not a predetermined condition 1 is satisfied.

The predetermined condition 1 may include a condition that a width of a target CU is equal to or less than a maximum size (for example, MaxTsSize of Versatile Video Coding (Draft 7), JVET-N 1001) when the transform skip is applied.

Furthermore, the predetermined condition 1 may include a condition that a height of the target CU is equal to or less than the maximum size (for example, MaxTsSize of Versatile Video Coding (Draft 7), JVET-N 1001) when the transform skip is applied.

Here, the intra prediction mode decoding unit 242B may use an actual CU size (width/height) of the chroma signal according to a sampling ratio of the chroma signal for the width and height of the CU. For example, in a case of YUV 4:2:0 sampling, the CU size (width/height) of the chroma signal is halved compared to a case of the luma signal.

In addition, the predetermined condition 1 may include a condition that block differential pulse code modulation (BDPCM) is enabled in a sequence parameter set (SPS) (for example, a value of sps_bdpcm_chroma_enabled_flag is larger than "0").

In a case where all of the predetermined conditions 1 are satisfied, this operation proceeds to Step S602, and in a case where none of the predetermined conditions 1 is satisfied, this operation proceeds to Step S603.

In Step S602, the intra prediction mode decoding unit 242B decodes intra_bdpcm_chroma_flag. intra_bdpcm_chroma_flag of "1" indicates that the BDPCM is applied to a target chroma CU, and intra_bdpcm_chroma_flag of "0" indicates that the BDPCM is not applied.

In Step S603, the intra prediction mode decoding unit 242B determines whether or not the value of intra_bdpcm_chroma_flag is larger than "0".

Here, in a case where the intra prediction mode decoding unit 242B determines that the value of intra_bdpcm_chroma_flag is larger than "0", this operation proceeds to Step S608, and otherwise, this operation proceeds to Step S604. Note that, in a case where the predetermined condition 1 is not satisfied and the processing of Step S602 is skipped, the intra prediction mode decoding unit 242B regards the value of intra_bdpcm_chroma_flag as "0".

In Step S608, the intra prediction mode decoding unit 242B decodes intra_bdpcm_chroma_dir_flag. intra_bdpcm_chroma_dir_flag indicates whether prediction is performed in a vertical direction or in a horizontal direction when the BDPCM is applied to the target chroma CU. After the processing of Step S608 ends, this operation proceeds to Step S610 and the processing ends.

In Step S604, the intra prediction mode decoding unit 242B determines whether or not a predetermined condition 2 is satisfied.

The predetermined condition 2 may include a condition that chrominance linear prediction (cross-component linear model (CCLM)) can be used in the target chroma CU.

Here, in a case where it is determined that the predetermined condition 2 is satisfied, this operation proceeds to Step S605, and otherwise, this operation proceeds to Step S606.

In Step S605, the intra prediction mode decoding unit 242B decodes cclm_mode_flag. cclm_mode_flag of "1" indicates that the CCLM is applied to the target chroma CU, and cclm_mode_flag of "0" indicates that the CCLM is not applied.

In Step S606, the intra prediction mode decoding unit 242B determines whether or not the value of cclm_mode_flag is larger than "0".

Here, in a case where the intra prediction mode decoding unit 242B determines that the value of cclm_mode_flag is larger than "0", this operation proceeds to Step S609, and otherwise, this operation proceeds to Step S607. Note that, in a case where the predetermined condition 2 is not satisfied and the processing of Step S605 is skipped, the intra prediction mode decoding unit 242B regards the value of cclm_mode_flag as "0".

In Step S609, the intra prediction mode decoding unit 242B decodes cclm_mode_idx. After the processing of Step S609 ends, this operation proceeds to Step S610 and the processing ends.

In Step S607, the intra prediction mode decoding unit 242B decodes a normal intra prediction mode (intra_chroma_pred_mode). After the processing of Step S607 ends, this operation proceeds to Step S610 and the processing ends.

As described above, in a case where the BDPCM is applied to a chrominance block, information regarding a prediction direction of the BDPCM is decoded, and in a case where the BDPCM is not applied to the chrominance block, the intra prediction mode decoding unit 242B is configured to decode information regarding the CCLM or the normal intra prediction mode, so that it is possible to ensure that the BDPCM, the CCLM, and the normal intra prediction mode can be appropriately selected for each block.

In addition, as described above, by configuring the intra prediction mode decoding unit 242B to use the size of the chroma CU in the determination of the applicability of the chroma BDPCM, it is possible to perform the determination according to the actual size of the chroma CU even when a chrominance sampling scheme is changed like 4:2:0, 4:2:2, and 4:4:4.

The prediction signal generation unit 242C illustrated in FIG. 5 is configured to generate the prediction signal based on the prediction mode of the processing target block decoded by intra prediction mode decoding unit 242B. Here, as a method for generating the prediction signal, for example, a known method described in Versatile Video Coding (Draft 7), JVET-N 1001 can be used.

Figure 7:
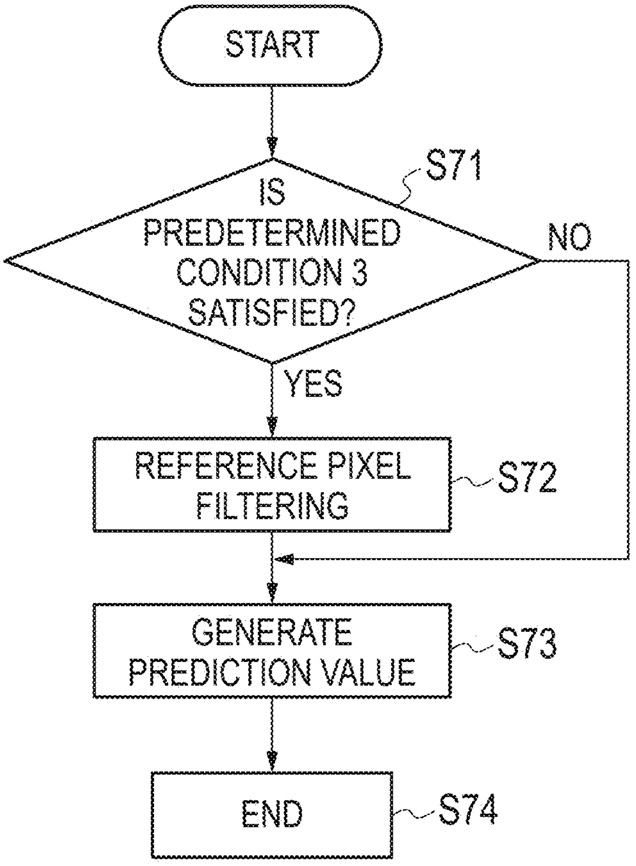
FIG. 7 is a flowchart illustrating an example of a processing flow in a case where block differential pulse code modulation (BDPCM) is applied to a luma encoding unit (CU) or a chroma CU by a prediction signal generation unit 242C of the intra prediction unit 240 of the image decoding device 200 according to the embodiment.

FIG. 7 is a flowchart illustrating an example of a processing flow in a case where the BDPCM is applied to the luma CU or the chroma CU by the prediction signal generation unit 242C. Hereinafter, an example of such a processing flow will be described with reference to FIG. 7.

In Step S71, the prediction signal generation unit 242C determines whether or not a predetermined condition 3 is satisfied.

Here, the predetermined condition 3 may include a condition that filtering of a reference pixel to be used in prediction of the BDPCM is enabled.

For example, by providing a flag for controlling whether or not the reference pixel filtering is enabled or disabled at the time of the BDPCM in a header such as the sequence parameter set (SPS), the picture parameter set (PPS), a picture header, or the slice header, it is possible to perform switching between enabling and disabling of the filtering.

Furthermore, the predetermined condition 3 may include a condition that an encoding tool for screen contents, such as a palette mode, is disabled in a slice to which the target CU belongs.

Whether or not the encoding tool for screen contents, such as the palette mode, is enabled or disabled can be determined, for example, by checking a value of a flag for controlling enabling/disabling of the palette mode included in a header such as the SPS, the PPS, the picture header, or the slice header.

Here, in a case where the prediction signal generation unit 242C determines that the predetermined condition 3 is satisfied, this operation proceeds to Step S72, and otherwise, this operation proceeds to Step S73.

In Step S72, the prediction signal generation unit 242C performs filtering processing for smoothing the reference pixel to be used in prediction.

For example, for the chroma signal, the prediction signal generation unit 242C can determine a position of the reference pixel to be used in prediction based on a value of intra_bdpcm_chroma_dir_flag. Also for the luma signal, the prediction signal generation unit 242C can determine a position of the reference pixel to be used in prediction based on similar information.

The filtering processing can be performed, for example, by convolving a linear filter in which a weight of a coefficient is {1/4,2/4,1/4}. After the filtering processing is completed, this operation proceeds to Step S73.

In Step S73, the prediction signal generation unit 242C generates a prediction value by using the reference pixel that is smoothed in Step S72 or the reference pixel that is not smoothed.

A known method can be used for details of the prediction value generation processing, and thus a detailed description thereof will be omitted. After the prediction value generation processing is completed, this operation proceeds to Step S74 and the processing ends.

As described above, the intra prediction unit 242 includes the prediction signal generation unit 242C, and the prediction signal generation unit 242C is configured to perform the smoothing processing on the reference pixel used for the prediction value generation prior to the prediction value generation processing using the BDPCM, so that even in a case where noise such as imaging noise is superimposed on the reference pixel, an effect of reducing the noise can be expected, prediction accuracy can be improved, and encoding efficiency can be improved.

Furthermore, as described above, the intra prediction unit 242 includes the prediction signal generation unit 242C, and the prediction signal generation unit 242C is configured to control whether or not to perform the smoothing processing on the reference pixel used for the prediction value generation prior to the prediction value generation processing using the BDPCM according to the value of the flag that is included in the header and used to control enabling/disabling of the reference pixel filtering at the time of the BDPCM, so that the smoothing is performed on a video which is captured by a camera and for which the smoothing is considered to be enabled, and the smoothing is not performed on a screen content for which the smoothing is considered to be unnecessary, whereby an unintended decrease in encoding efficiency can be prevented.

Furthermore, as described above, the intra prediction unit 242 includes the prediction signal generation unit 242C, and the prediction signal generation unit 242C is configured to control whether or not to perform the smoothing processing on the reference pixel used for the prediction value generation prior to the prediction value generation processing using the BDPCM depending on whether or not the encoding tool for the screen content is enabled, so that the smoothing is performed on a video which is captured by a camera and for which the smoothing is enabled, and the smoothing is not performed on the screen content for which the smoothing is unnecessary, whereby an unintended decrease in encoding efficiency can be prevented.

(In-Loop Filter Processing Unit 250)

Figure 8:
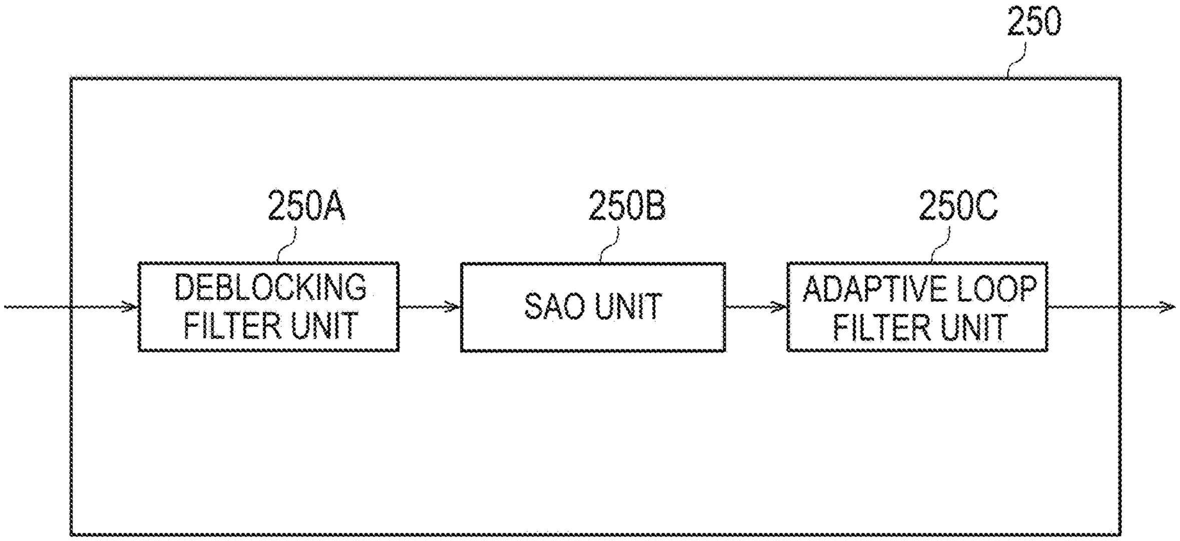
FIG. 8 is a diagram illustrating an example of functional blocks of an in-loop filter processing unit 250 of the image decoding device 200 according to the embodiment.

Hereinafter, the in-loop filter processing unit 250 according to the present embodiment will be described with reference to FIG. 8. FIG. 8 is a diagram illustrating an example of functional blocks of the in-loop filter processing unit 250 of the image decoding device 200 according to the present embodiment.

As illustrated in FIG. 8, the in-loop filter processing unit 250 includes a deblocking filter unit 250A, a sample adaptive offset (SAO) unit 250B, and an adaptive loop filter unit 250C.

The SAO unit 250B is configured to perform sample adaptive offset (SAO) processing. As the SAO unit 250B, known processing can be used, and thus a description of a specific processing content will be omitted.

Note that the configuration illustrated in FIG. 8 is merely an example. An order of the respective loop filter processing sets may be switched. Further, a configuration in which a part of the loop filter processing illustrated in FIG. 8 is omitted may be possible. In addition, loop filter processing not illustrated in FIG. 8 may be added.

Hereinafter, an example of processing contents of the deblocking filter unit 250A and the adaptive loop filter unit 250C will be described.

Figure 9:
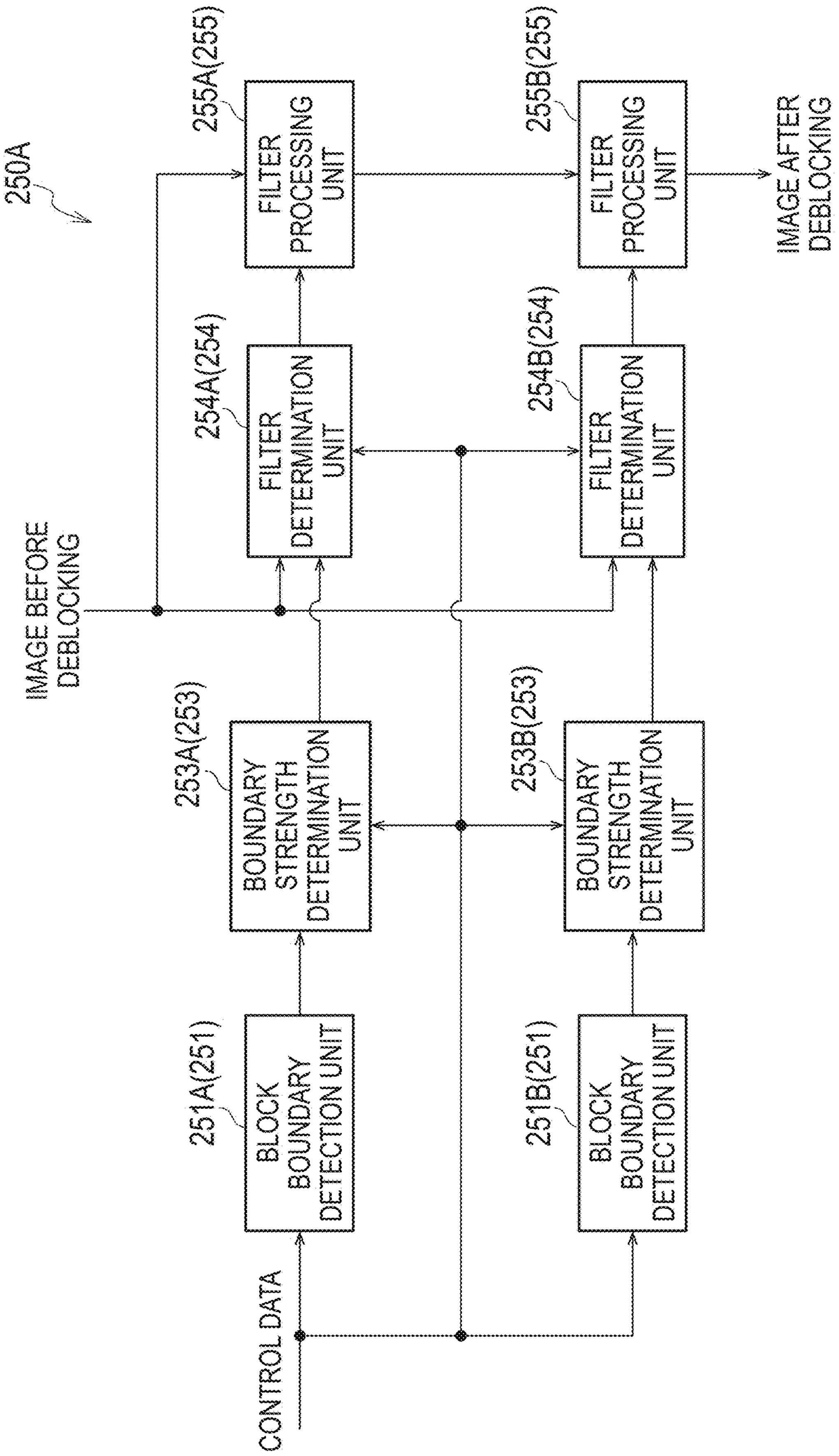
FIG. 9 is a diagram illustrating an example of functional blocks of a deblocking filter unit 250A of the in-loop filter processing unit 250 of the image decoding device 200 according to the embodiment.
Figure 11D:
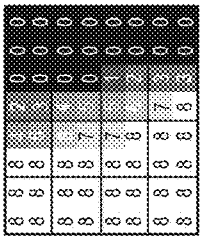
FIGS. 11A-11D are diagrams describing weighting factors of triangle partition mode (TPM) and geometrical partitioning (GEO).
Figure 11C:
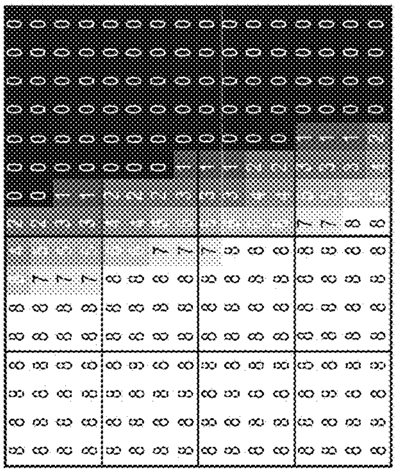
Figure 11B:
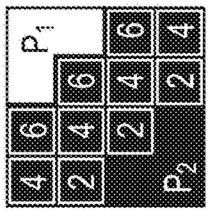
Figure 11A:
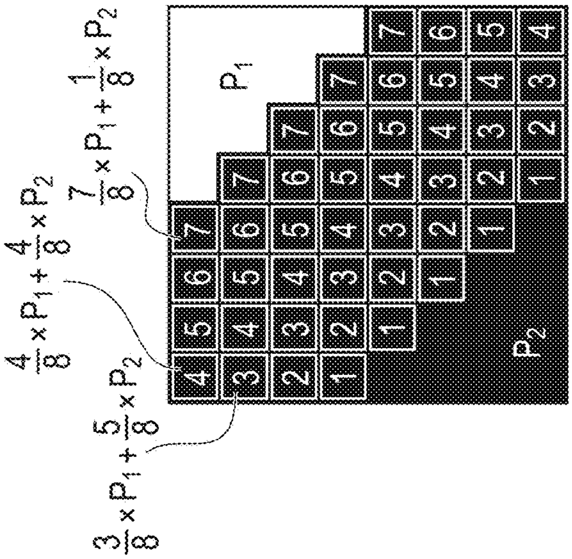

As illustrated in FIG. 9, the deblocking filter unit 250A includes block boundary detection units 251 (251A/251B), boundary strength determination units 253 (253A/253B), filter determination units 254 (254A/254B), and filter processing units 255 (255A/255B).

Here, the component with "A" at the end is a component related to deblocking filter processing for a block boundary in the vertical direction, and the component with "B" at the end is a component related to the deblocking filter processing for the block boundary in the horizontal direction.

Hereinafter, a case where the deblocking filter processing for the block boundary in the horizontal direction is performed after the deblocking filter processing for the block boundary in the vertical direction is performed will be described.

The deblocking filter processing may be applied to the encoding block, the prediction block, or the transformation block, as described above. Further, the deblocking filter processing may be applied to the sub-block obtained by dividing each of the above blocks. That is, the target block and the adjacent block may be the encoding blocks, the prediction blocks, the transformation blocks, or the sub-blocks obtained by dividing each of the above blocks.

In a case where the deblocking filter is applied to the sub-block, the block described below can be appropriately rephrased as the sub-block.

Since the deblocking filter processing for the block boundary in the vertical direction and the deblocking filter processing for the block boundary in the horizontal direction are similar processing sets, only the deblocking filter processing for the block boundary in the vertical direction will be described below.

The block boundary detection unit 251A is configured to detect a boundary (block boundary) between two adjacent blocks based on the control data indicating a block size.

Here, the blocks are an encoding block (CU), a prediction block (PU), and a transformation block (TU). A known method can be applied as a specific detection method, and thus a detailed description thereof will be omitted.

The boundary strength determination unit 253A is configured to determine a boundary strength of the block boundary between the target block and the adjacent block.

In addition, the boundary strength determination unit 253A may be configured to determine the boundary strength of the block boundary based on the control data indicating whether or not the target block and the adjacent block are intra prediction blocks.

For example, as illustrated in FIG. 10, the boundary strength determination unit 253A may be configured to determine that the boundary strength of the block boundary is "0" in a case where at least one of the target block or the adjacent block is a lossless block.

Here, the lossless block may be defined as a block to which the transform skip is applied and in which the value of the quantization parameter is equal to or less than a predetermined threshold value (first threshold value).

Alternatively, the lossless block may be defined as a block to which the transform skip is applied and in which the value of the quantization parameter is equal to the first threshold value.

For example, the first threshold value may be the minimum value of the quantization parameter in the transform skip mode (QpPrimeTsMin described above). Furthermore, for example, the first threshold value may be set to "4".

Alternatively, the lossless block may be defined as a block in which the value of the quantization parameter is equal to or less than the first threshold value regardless of whether or not the transform skip is applied. For example, the first threshold value may be the minimum value of the quantization parameter in the transform skip mode (QpPrimeTsMin described above). For example, the threshold value may be set to "4".

For example, as illustrated in FIG. 10, the boundary strength determination unit 253A may be configured to determine that the boundary strength of the block boundary is "0" in a case where the above-described block boundary is a sub-block boundary, affine motion compensation prediction is applied to the target CU, and PROF is enabled in the picture header.

For example, as illustrated in FIG. 10, the boundary strength determination unit 253A may be configured to determine that the boundary strength of the block boundary is "2" in a case where at least one of the target block or the adjacent block is the intra prediction block (that is, in a case where at least one of the blocks on both sides of the block boundary is the intra prediction block).

Furthermore, the boundary strength determination unit 253A may be configured to determine the boundary strength of the block boundary based on the control data indicating whether or not a non-zero (0) orthogonal transform coefficient is included in the target block and the adjacent block and whether or not the block boundary is a boundary (TU boundary) of the transformation block.

For example, as illustrated in FIG. 10, the boundary strength determination unit 253A may be configured to determine that the boundary strength of the block boundary is "1" in a case where at least one of the target block or the adjacent block includes the non-zero orthogonal transform coefficient, and the block boundary is the boundary of the transformation block (that is, in a case where the non-zero transform coefficient is present in at least one of the blocks on both sides of the block boundary and the block boundary is the boundary of the TU).

Furthermore, the boundary strength determination unit 253A may be configured to determine the boundary strength of the block boundary based on the control data indicating whether or not an absolute value of a difference between motion vectors of the target block and the adjacent block is equal to or more than a threshold value (for example, 1/2 pixel).

For example, as illustrated in FIG. 10, the boundary strength determination unit 253A may be configured to determine that the boundary strength of the block boundary is "1" in a case where the absolute value of the difference between the motion vectors of the target block and the adjacent block is equal to or more than the threshold value (for example, 1/2 pixel) (that is, in a case where the absolute value of the difference between the motion vectors of the blocks on both sides of the block boundary is equal to or more than the threshold value (for example, 1/2 pixel)).

Furthermore, the boundary strength determination unit 253A may be configured to determine the boundary strength of the block boundary based on the control data indicating whether or not a reference block referred to in motion vector prediction is different between the target block and the adjacent block.

For example, as illustrated in FIG. 10, the boundary strength determination unit 253A may be configured to determine that the boundary strength of the block boundary is "1" in a case where the reference block referred to in motion vector prediction is different between the target block and the adjacent block (that is, in a case where a reference image is different between the blocks on both sides of the block boundary).

The boundary strength determination unit 253A may be configured to determine the boundary strength of the block boundary based on the control data indicating whether or not the number of motion vectors is different between the target block and the adjacent block For example, as illustrated in FIG. 10, the boundary strength determination unit 253A may be configured to determine that the boundary strength of the block boundary is "1" in a case where the number of motion vectors is different between the target block and the adjacent block (that is, in a case where the number of motion vectors is different between the blocks on both sides of the block boundary).

The boundary strength determination unit 253A may be configured to determine the boundary strength of the block boundary based on the types of the inter prediction modes of the target block and the adjacent block.

For example, as illustrated in FIG. 10, the boundary strength determination unit 253A may be configured to determine that the boundary strength of the block boundary is "1" in a case where the above-described block boundary is the CU boundary and the TPM is used in at least one of the target block or the adjacent block.

Alternatively, the boundary strength determination unit 253A may be configured to determine that the boundary strength of the block boundary is "1" in a case where the above-described block boundary is the CU boundary, the TPM is used in at least one of the target block or the adjacent block, and a value of a weighting factor described later satisfies a predetermined condition.

For example, as illustrated in FIG. 10, the boundary strength determination unit 253A may be configured to determine that the boundary strength of the block boundary is "1" in a case where the above-described block boundary is the CU boundary and the GEO is used in at least one of the target block or the adjacent block.

Alternatively, the boundary strength determination unit 253A may be configured to determine that the boundary strength of the block boundary is "1" in a case where the above-described boundary is the CU boundary, the GEO is used in at least one of the target block or the adjacent block, and the value of the weighting factor described later satisfies the predetermined condition.

For example, as illustrated in FIG. 10, the boundary strength determination unit 253A may be configured to determine that the boundary strength of the block boundary is "0" in a case where none of the above-described conditions is satisfied.

Note that, the larger the value of the boundary strength is, the higher the possibility that block distortion occurs at the block boundary is.

In the above-described boundary strength determination method, the determination may be made for the luma signal and the chroma signal by a common method, or the determination may be made for the luma signal and the chroma signal by using partially different conditions.

The weighting factor of the TPM or GEO will be described below with reference to FIGS. 11(*a*) to 11(*d*). The TPM and the GEO are modes in which a block having a rectangular shape (including a square shape) is divided into two regions by a straight line, and motion compensation prediction is performed using different motion vectors in the respective regions.

In the TPM, a division boundary is limited to a rectangular diagonal, and in the GEO, division can be made with a higher degree of freedom. Details of the TPM and the GEO can follow the specifications described in Versatile Video Coding (Draft 7), JVET-N 1001 thus, a detailed description thereof will be omitted.

In the TPM and the GEO, in a pixel near the division boundary described above, prediction values by two vectors corresponding to the respective divided regions are weighted and combined, and the weights are defined to be changed in a gradation manner, so that the prediction values are smoothly combined.

FIGS. 11(*a*) to 11(*d*) are diagrams illustrating examples of weighting factors at the time of the combination. In FIGS. 11(*a*) to 11(*d*), the weighting factor is set to 0/8 to 8/8, and a numerator of a weight of a prediction value (P1) by the first motion vector is illustrated. Note that a weight of a prediction value (P2) by the second motion vector can be calculated by 1−(the weight of P1).

A predetermined condition 4 of the weighting factor at the time of determining the boundary strength described above can be defined as follows, for example, in a case where the determination of the boundary strength is performed every four pixels.

The predetermined condition 4 may be defined as a condition that a value obtained by adding weighting factor values of pixels at four corners of a 4×4 pixel block adjacent to the target block boundary (four pixels) is equal to or more than a second threshold value and equal to or less than a third threshold value (or more than the second threshold value and less than the third threshold value).

Alternatively, the predetermined condition 4 may be defined as that at least one of the weighting factor values of the respective pixels of the target boundary (four pixels) is other than 0 (=0/8) or 1 (=8/8).

The filter determination unit 254A is configured to determine a type of the filter processing (for example, the deblocking filter processing) to be applied to the block boundary.

For example, the filter determination unit 254A may be configured to determine whether or not to apply the filter processing to the block boundary, and whether to apply either weak filter processing or strong filter processing to the block boundary based on the boundary strength of the block boundary, the quantization parameter included in the target block and the adjacent block, and the like.

The filter determination unit 254A may be configured to determine not to apply the filter processing in a case where the boundary strength of the block boundary is "0".

The filter processing unit 255A is configured to perform processing on an image before deblocking based on the determination of the filter determination unit 254A. The processing performed on the image before deblocking includes no filter processing, the weak filter processing, the strong filter processing, and the like.

That is, the deblocking filter unit 250A is configured to control, based on whether or not at least one of two adjacent blocks satisfies a first condition that the value of the quantization parameter is equal to or less than a predetermined threshold value, the deblocking filter applied to a boundary between the two blocks.

Alternatively, the deblocking filter unit 250A is configured to control, based on whether or not at least one of two adjacent blocks satisfies the first condition that the value of the quantization parameter is a predetermined threshold value, the deblocking filter applied to a boundary between the two blocks.

Alternatively, the deblocking filter unit 250A is configured to set the boundary strength used for controlling the deblocking filter applied to the boundary to "0" in a case where at least one of two adjacent blocks satisfies the first condition.

Alternatively, the deblocking filter unit 250A is configured to set the boundary strength used for controlling the deblocking filter applied to the boundary to "0" in a case where at least one of two adjacent blocks satisfies both the first condition and a second condition that the transform skip mode is applied.

As described above, as the boundary strength of the boundary of the lossless block is set to "0", the deblocking filter is not applied to all the pixels in the target block, and lossless performance in units of blocks can be secured.

Figure 12:
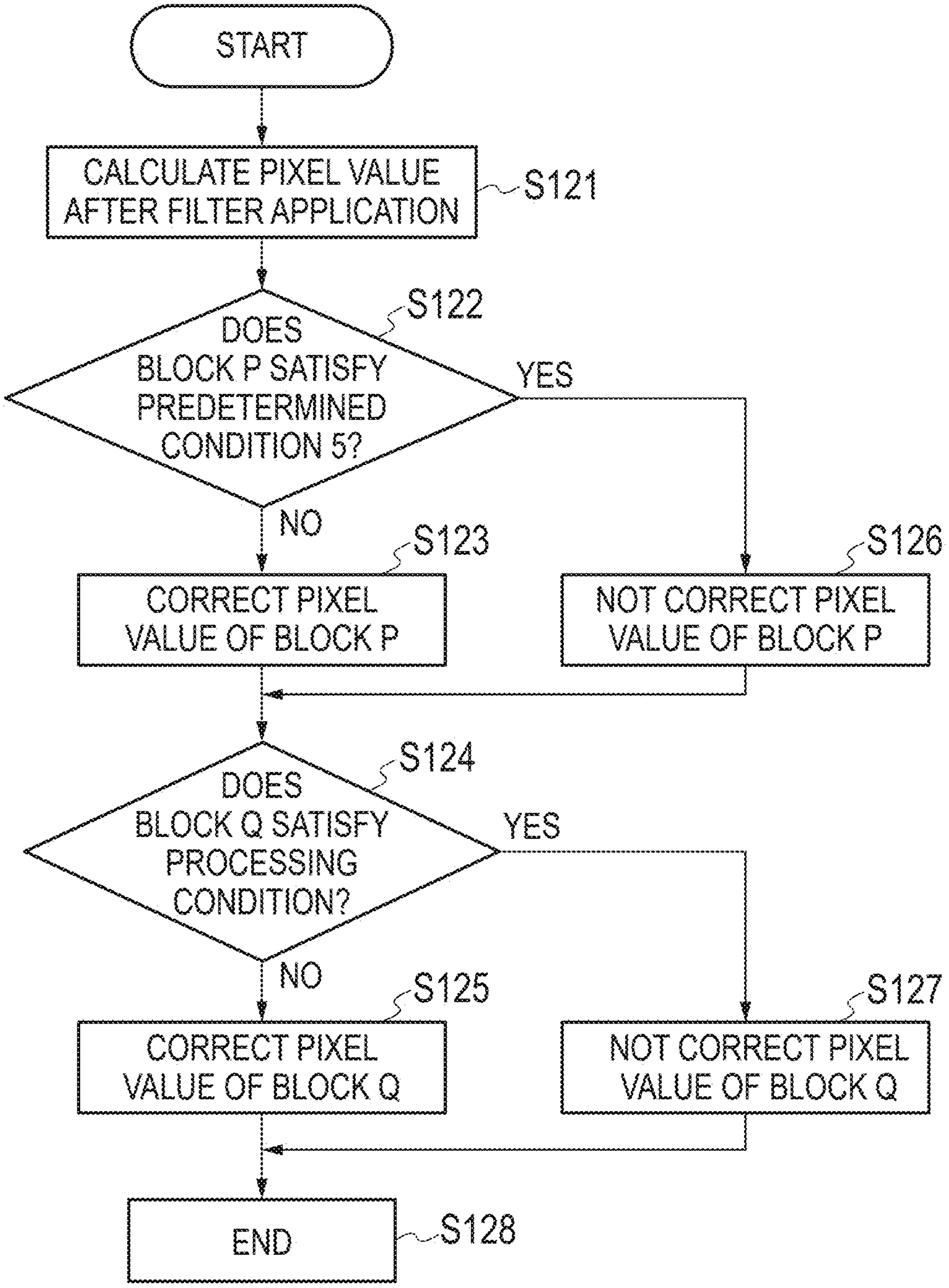
FIG. 12 is a flowchart illustrating an example of a processing flow of a filter processing unit 255A/255B of the in-loop filter processing unit 250 of the image decoding device 200 according to the embodiment.

FIG. 12 is a flowchart illustrating an example of a processing flow of the filter processing unit 255A. Hereinafter, an example of the processing flow of the filter processing unit 255A will be described with reference to FIG. 12.

In Step S121, the filter processing unit 255A calculates a pixel value after filter application according to the filter processing determined by the filter determination unit 254A.

In Step S122, the filter processing unit 255A determines whether or not a block P satisfies a predetermined condition 5.

Hereinafter, one of two blocks adjacent to the target block boundary is referred to as the block P, and the other is referred to as a block Q.

For example, the predetermined condition 5 may include a condition that the palette mode is applied to the block P.

Alternatively, for example, the predetermined condition 5 may include a condition that the block P is the lossless block. Here, as the definition of the lossless block, for example, a definition similar to the definition in the description of the boundary strength determination unit 253A can be used.

In a case where the filter processing unit 255A determines that the predetermined condition 5 is satisfied, this operation proceeds to Step S126, otherwise, this operation proceeds to Step S123.

In Step S123, the filter processing unit 255A reflects the pixel values after filter application generated in Step S121 in an image after filter processing.

On the other hand, in Step S126, the filter processing unit 255A performs processing in such a manner as not to reflect the pixel value after filter application generated in Step S121 in a pixel value of the block P.

Specifically, for example, a value of a parameter n, which indicates that "the pixel value after filter application is applied to a pixel n pixels away from the boundary on the block P side", can be set to "0".

Alternatively, for example, the pixel value after the filter application can be replaced with a pixel value before filter application. Note that a method other than the exemplified method may be used as long as the pixel value after filter application is not reflected in the pixel in the block P as a result.

Next, in Steps S124, S125, and S127, the same processing sets as those in Steps S122, S123, and S126 described above are performed on the block Q, and then this operation proceeds to Step S128 and the processing ends.

That is, the deblocking filter unit 250A is configured not to apply the deblocking filter to the pixel inside the block satisfying the first condition that the value of the quantization parameter is equal to or less than the predetermined threshold value.

Alternatively, the deblocking filter unit 250A is configured not to apply the deblocking filter to the pixel inside the block satisfying the first condition that the value of the quantization parameter is the predetermined threshold value.

Alternatively, the deblocking filter unit 250A is configured to control the deblocking filter applied to the boundary based on whether or not the block satisfies both the first condition and the second condition that the transform skip mode is applied.

Alternatively, the deblocking filter unit 250A is configured not to apply the deblocking filter to the pixel inside the block satisfying both the first condition and the second condition.

Note that the threshold value of the first condition may be "4". Alternatively, the threshold value of the first condition may be the minimum value of the quantization parameter in the transform skip mode, that is, QpPrimeTsMin.

As described above, as the pixel value after filter application is not reflected in the lossless block, it is possible to secure lossless performance in units of blocks.

Furthermore, as described above, at the block boundary to which the TPM or GEO is applied, the boundary strength may be controlled according to the value of the weighting factor.

Furthermore, as described above, at the block boundary to which the TPM or GEO is applied, the boundary strength may be controlled depending on whether or not the condition the value obtained by adding the weighting factor values of the pixels at four corners of the 4×4 pixel block adjacent to the target block boundary (four pixels) is equal to or more than the second threshold value and equal to or less than the third threshold value (or more than the second threshold value and less than the third threshold value) is satisfied.

Furthermore, as described above, at the block boundary to which the TPM or GEO is applied, the boundary strength may be controlled depending on whether or not the condition that at least one of the weighting factor values of the respective pixels of the target boundary (four pixels) is other than 0 (=0/8) or 1 (=8/8) is satisfied.

With the above-described configuration, even in a case where the value or number of motion vectors (MV) between adjacent blocks does not satisfy a desired condition, the deblocking filter can be appropriately applied to the boundary to which the TPM or GEO is applied and at which the value of weighting factor is different and block distortion is likely to actually occur.

Furthermore, as described above, the boundary strength determination unit 253A may be configured to determine that the boundary strength of the block boundary is "0" in a case where the above-described block boundary is the sub-block boundary, the affine motion compensation prediction is applied to a CU to which an adjacent sub-block belongs, and the PROF is enabled in the picture header.

With the above-described configuration, it is possible to prevent the deblocking filter from being unnecessarily applied to the value after application of the PROF processing for refining the prediction value in units of pixels, and improvement in subjective image quality can be expected.

Figure 13:
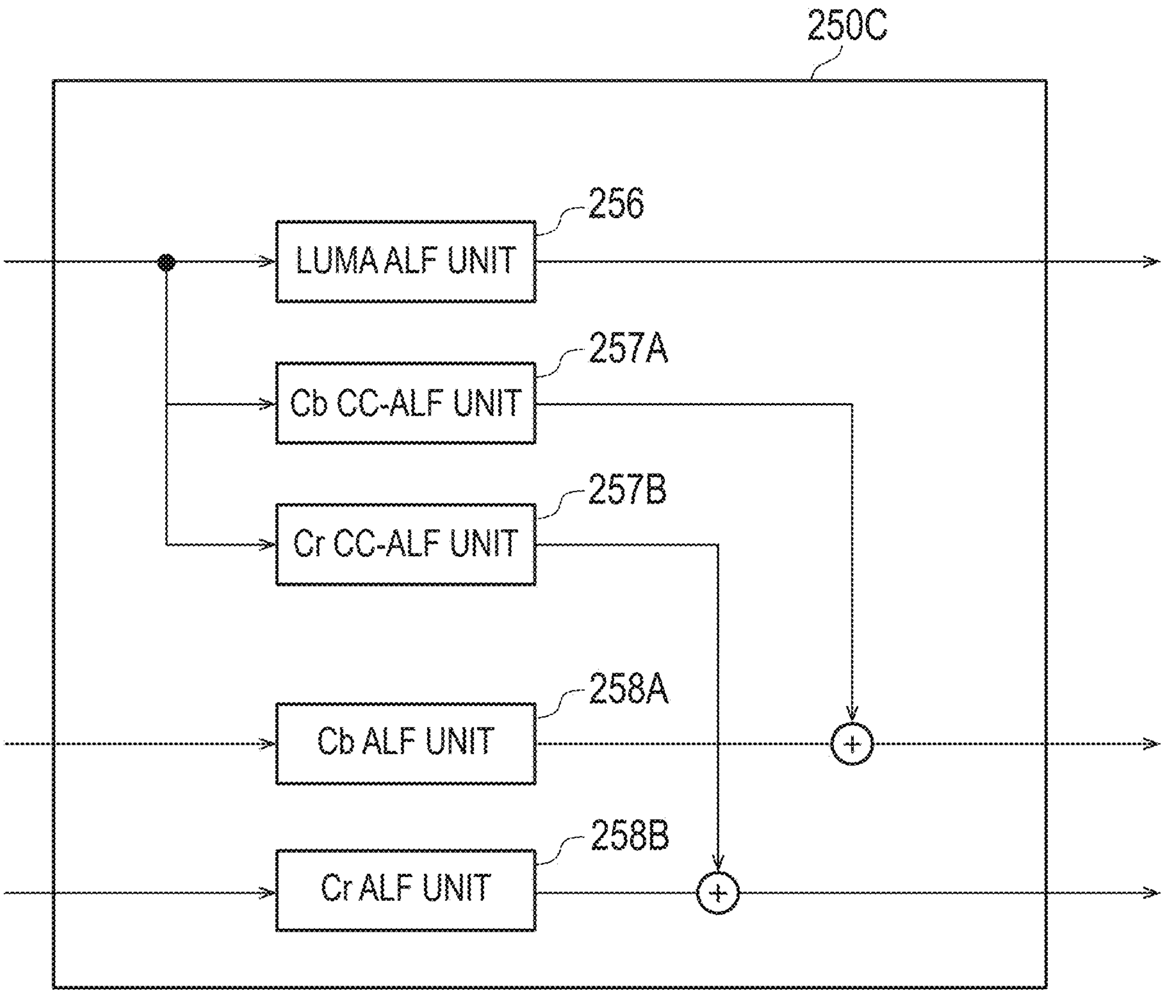
FIG. 13 is a diagram illustrating an example of functional blocks of an adaptive loop filter unit 250C of the in-loop filter processing unit 250 of the image decoding device 200 according to the embodiment.
Figure 14A:
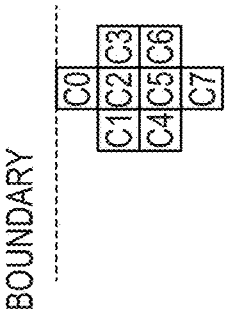
FIGS. 14A-14E are diagrams illustrating an example of filtering processing in a Cb CC-ALF unit 257A of the adaptive loop filter unit 250C of the in-loop filter processing unit 250 of the image decoding device 200 according to the embodiment and processing at a boundary portion.
Figure 14B:
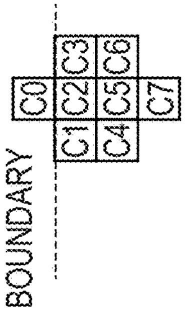
Figure 14C:
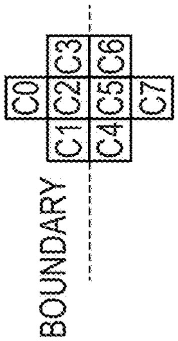
Figure 14D:
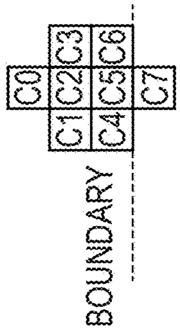
Figure 14E:
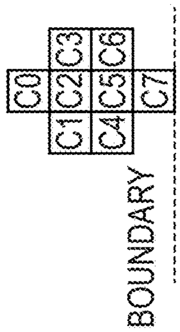

As illustrated in FIG. 13, the adaptive loop filter unit 250C includes a luma ALF unit 256, a Cb CC-ALF unit 257A, a Cr CC-ALF unit 257B, a Cb ALF unit 258A, and a Cr ALF unit 258B.

As processing performed by the luma ALF unit 256, the Cb ALF unit 258A, and the Cr ALF unit 258B, for example, the processing described in Versatile Video Coding (Draft 7), JVET-N 1001 can be applied, and thus a detailed description thereof will be omitted.

Hereinafter, an example of processing contents of the Cb CC-ALF unit 257A and the Cr CC-ALF unit 257B will be described. Note that the Cb CC-ALF unit 257A and the Cr CC-ALF unit 257B are different only in that the target is the Cb signal or the Cr signal, and the processing contents are the same. Therefore, only an operation of the Cb CC-ALF unit 257A will be described below, and a description of the Cr CC-ALF unit 257B will be omitted.

As illustrated in FIG. 13, the Cb CC-ALF unit 257A is configured to receive the luma signal before the filtering processing is performed by the luma ALF unit 256 and add an output value to an output of the Cb ALF unit 258A to generate a signal after filter processing of the Cb signal.

FIGS. 14 and 15 are diagrams illustrating an example of filtering processing in the Cb CC-ALF unit 257A and processing at a boundary portion.

Here, for example, as illustrated in FIGS. 14(*a*) to 14(*e*), a case of applying, to the luma signal, a two-dimensional filter in which eight filter coefficients C0 to C7 are arranged as illustrated in FIG. 14, and calculating a value to be added to the Cb signal is considered.

Note that a pixel position [y][x] of the luma signal that corresponds to a coefficient C2 is a pixel position corresponding to a pixel of the Cb signal to which the value calculated by the Cb CC-ALF unit 257A is to be added.

The value to be added to the Cb signal can be calculated by, for example, an equation illustrated in FIG. 15. Here, P[y][x] means a pixel value of the luma signal present at the pixel position [y][x].

FIGS. 14(*a*) to 14(*e*) illustrate a relationship between a processing boundary such as a virtual boundary and arrangement of the filter coefficients. Here, the boundary is a boundary line that prohibits reference to a pixel positioned outside the boundary, such as a boundary of parallel processing units such as slices and tiles defined in the specification, or a virtual boundary provided for implementing pipeline processing.

Of two regions divided by the boundary, a region where the pixel corresponding to the filter coefficient C2 is present is considered as the inside of the boundary, and the other region is considered as the outside of the boundary. In a case where a reference pixel position is outside the boundary, the pixel value at the position cannot be actually referred to, and thus, it is necessary to perform padding processing. Specifically, as in a table illustrated in FIG. 15, the padding processing can be implemented by changing the actual reference pixel position according to the boundary and an arrangement pattern of the filter coefficients.

FIG. 14(*e*) illustrates an example of a case where the padding is not necessary. Values of offset1 to offset3 in a case where the padding is not necessary are as illustrated in the table in FIG. 15.

On the other hand, for example, in the arrangement of FIG. 14(*c*), since pixels corresponding to the filter coefficients C4 to C7 are positioned outside the boundary, the filtering can be implemented by setting the values of the corresponding offset2 and offset3 to “0”.

Furthermore, in the arrangement of FIG. 14(*c*), a pixel corresponding to the filter coefficient C0 is positioned inside the boundary and thus can be referred to. However, in a case of adopting a method similar to a padding method (mirror padding) performed by the luma ALF unit 256, the Cb ALF unit 258A, and the Cr ALF unit 258B in Versatile Video Coding (Draft 7), JVET-N 1001, since the padding is also performed on the filter coefficient C0 side, offset1 is also set to “0”.

The mirror padding is a method of performing the padding also for a line that comes out of the boundary in a case where the filter coefficients are folded and inverted around a horizontal line where the filter coefficient C2 is present in FIG. 14(*c*).

In a case of FIG. 14(*b*), since a line corresponding to offset1 is outside the boundary, offset1 is set to “0”, and offset2 and offset3 are also set to “0” according to the mirror padding method.

In a case of FIG. 14(*d*), since a line corresponding to offset3 is outside the boundary, offset1 and offset2 are the same as in the case of FIG. 14(*e*), and only offset3 is changed to “1”.

Also in a case of FIG. 14(*a*), when the arrangement of the filter coefficients is folded around the line where the filter coefficient C2 is present, a line corresponding to the filter coefficient C7 comes out of the boundary. Therefore, in a case of performing the mirror padding, offset3 is corrected to 1 and the padding processing is performed.

On the other hand, in the case of FIG. 14(*a*), actually, there is no filter coefficient that refers to the outside of the boundary, and thus the padding is not necessarily required. Therefore, also in the case of FIG. 14(*a*), the value of offset can be set similarly to FIG. 14(*e*). In other words, the padding processing in the case of FIG. 14(*a*) does not have to be defined, and in a case where the padding processing is not defined, the setting of FIG. 14(*e*) may be used.

As described above, in the CC-ALF unit that receives the luma signal and adds the output to the chroma signal, in a case where a pixel of the luma signal that corresponds to a pixel of the chroma signal to which the output value is added (a luma signal pixel position corresponding to the coefficient C2) is one line below the boundary ((b) described above) or one line above the boundary ((c) described above), the padding processing is performed while setting all the offsets to be added to the reference pixel position to “0”, so that the padding processing can be performed by a method similar to the padding method (mirror padding) performed by the luma ALF unit 256, the Cb ALF unit 258A, and the Cr ALF unit 258B in Versatile Video Coding (Draft 7), JVET-N 1001, for example, and a control logic can be made common.

Furthermore, as described above, in the CC-ALF unit that receives the luma signal and adds the output to the chroma signal, the padding processing does not have to be performed when all the reference pixel positions are present inside the boundary, and the padding processing may be performed only when at least one of the reference pixel positions is present outside the boundary.

That is, it is possible to eliminate unnecessary padding processing and enhance the encoding efficiency by not defining the padding processing in the case of FIG. 14(*a*).

Figure 16:
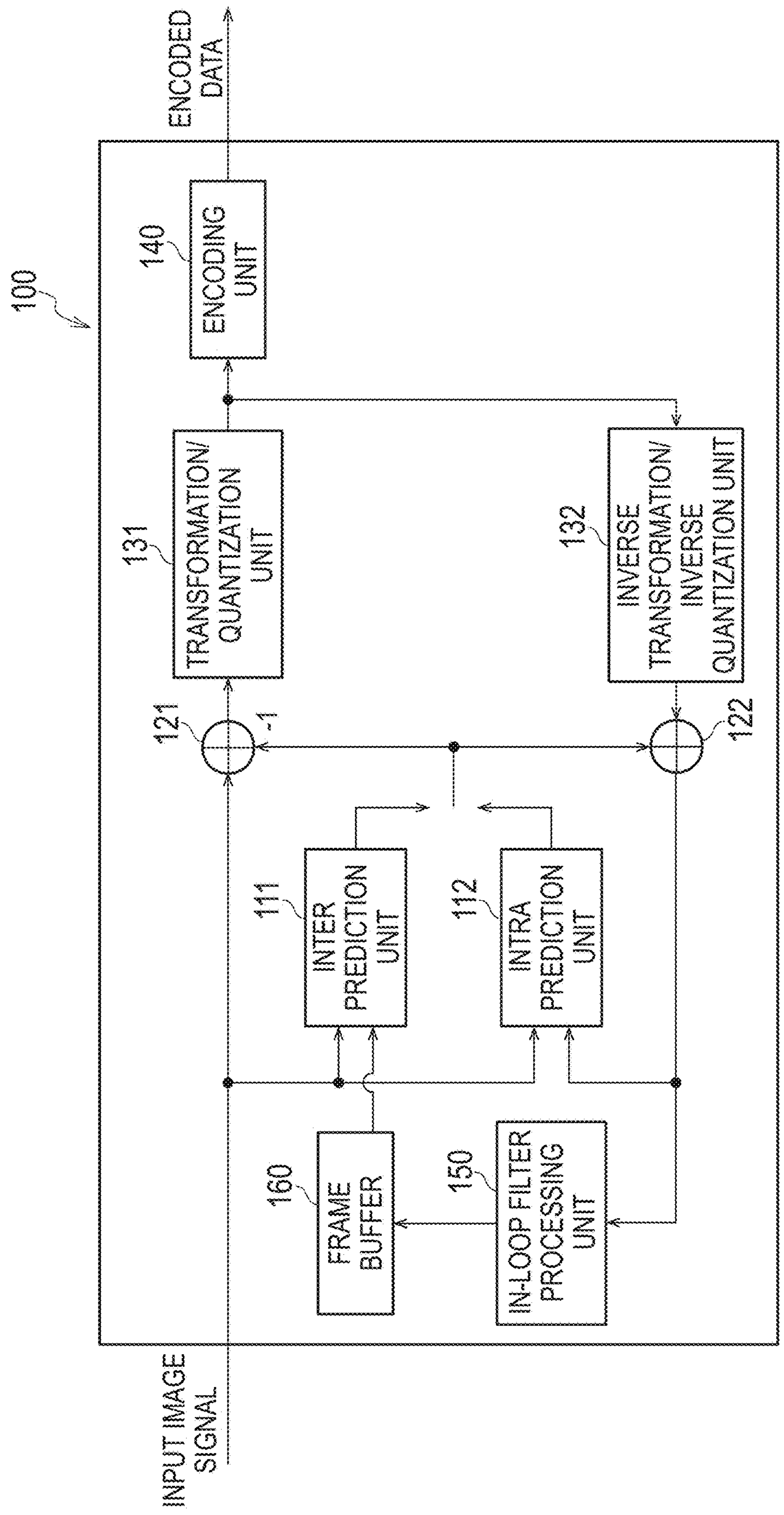
FIG. 16 is a diagram illustrating an example of functional blocks of an image encoding device 100 according to the embodiment.

Hereinafter, the image encoding device 100 according to the present embodiment will be described with reference to FIG. 16. FIG. 16 is a diagram illustrating an example of functional blocks of the image encoding device 100 according to the present embodiment.

As illustrated in FIG. 16, the image encoding device 100 includes an inter prediction unit 111, an intra prediction unit 112, a subtractor 121, an adder 122, a transformation/quantization unit 131, an inverse transformation/inverse quantization unit 132, an encoding unit 140, an in-loop filter processing unit 150, and a frame buffer 160.

Similarly to the inter prediction unit 241, the inter prediction unit 111 is configured to generate a prediction signal through inter prediction (inter-frame prediction).

Specifically, the inter prediction unit 111 is configured to specify, through comparison of an encoding target frame (hereinafter, target frame) and a reference frame stored in the frame buffer 160, a reference block included in the reference frame and determine a motion vector with respect to the specified reference block.

The inter prediction unit 111 is configured to generate, based on the reference block and the motion vector, for each prediction block, the prediction signal included in the prediction block. The inter prediction unit 111 is configured to output the prediction signal to the subtractor 121 and the adder 122. The reference frame is a frame different from the target frame.

Similarly to the intra prediction unit 242, the intra prediction unit 112 is configured to generate the prediction signal through intra prediction (intra-frame prediction).

Specifically, the intra prediction unit 112 is configured to specify the reference block included in the target frame and generate, for each prediction block, the prediction signal based on the specified reference block. The intra prediction unit 112 is configured to output the prediction signal to the subtractor 121 and the adder 122.

The reference block is a block referred to about a prediction target block (hereinafter, target block). For example, the reference block is a block adjacent to the target block.

The subtractor 121 is configured to subtract the prediction signal from the input image signal and output a prediction remainder signal to the transformation/quantization unit 131. The subtractor 121 is configured to generate the prediction remainder signal, which is a difference between the prediction signal generated by the intra prediction or the inter prediction and the input image signal.

The adder 122 is configured to add the prediction signal to the prediction remainder signal output from the inverse transformation/inverse quantization unit 132 to generate a decoded signal prior to the filtering process and output such a decoded signal prior to the filtering process to the intra prediction unit 112 and the in-loop filter processing unit 150.

The decoded signal prior to the filtering process configures the reference block used in the intra prediction unit 112.

The transformation/quantization unit 131 is configured to perform transformation processing of the prediction remainder signal and acquire a coefficient level value. Further, the transformation/quantization unit 131 may be configured to perform quantization of the coefficient level value.

The transformation processing for transforming the prediction remainder signal into a frequency component signal. In such transformation processing, a base pattern (a transformation matrix) corresponding to discrete cosine transform (DCT) may be used or a base pattern (a transformation matrix) corresponding to discrete sine transform (DST) may be used.

Similarly to the inverse transformation/inverse quantization unit 220, the inverse transformation/inverse quantization unit 132 is configured to perform inverse transformation processing of the coefficient level value output from the transformation/quantization unit 131. The inverse transformation/inverse quantization unit 132 is configured to perform inverse quantization of the coefficient level value prior to the inverse transformation processing.

The inverse transformation processing and the inverse quantization are performed in a procedure opposite to the transformation processing and the quantization performed in the transformation/quantization unit 131.

The encoding unit 140 is configured to encode the coefficient level value output from the transformation/quantization unit 131 and output encoded data.

For example, the encoding is entropy encoding for allocating a code of different length based on an occurrence probability of the coefficient level value.

The encoding unit 140 is configured to encode, in addition to the coefficient level value, control data used in decoding processing.

As described above, the control data may include size data such as the size of the encoding block, the size of the prediction block, and the size of the transformation block.

Similarly to the in-loop filter processing unit 250, the in-loop filter processing unit 150 is configured to perform filter processing on the decoded signal prior to the filtering process output from the adder 122 and output a filtered decoded signal to the frame buffer 160.

The frame buffer 160 is configured to accumulate the reference frame used in the inter prediction unit 111.

The filtered decoded signal configures the reference frame used in the inter prediction unit 111.

(Intra Prediction Unit 112)

Figure 17:
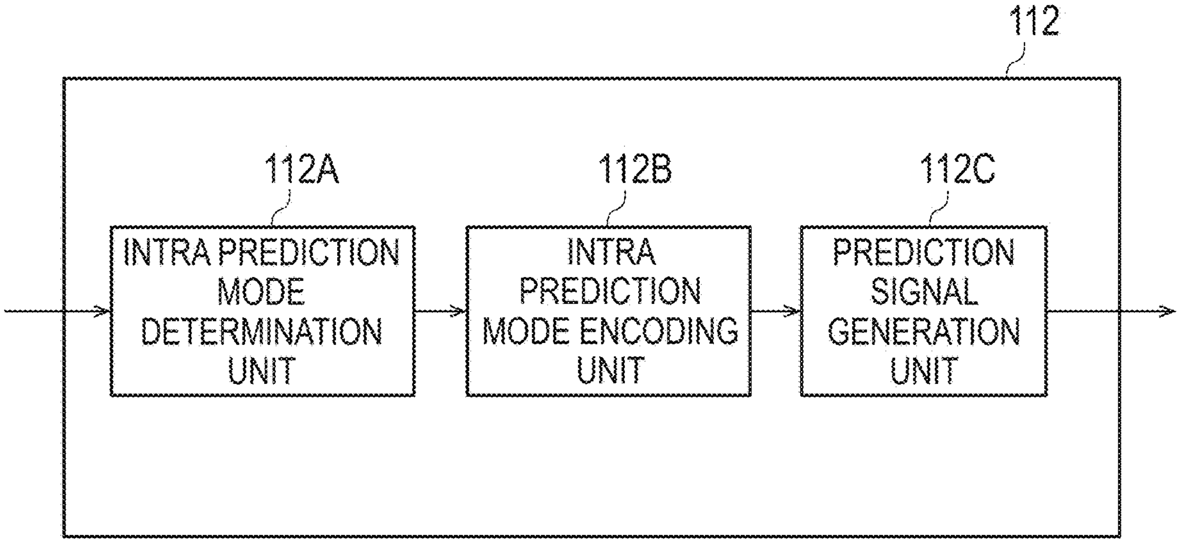
FIG. 17 is a diagram illustrating an example of functional blocks of an intra prediction unit 112 of the image encoding device 100 according to the embodiment.

Hereinafter, the intra prediction unit 112 according to the present embodiment will be described with reference to FIG. 17. FIG. 17 is a diagram illustrating an example of functional blocks of the intra prediction unit 112 of the image encoding device 100 according to the present embodiment.

As illustrated in FIG. 17, the intra prediction unit 112 includes an intra prediction mode determination unit 112A, an intra prediction mode encoding unit 112B, and a prediction signal generation unit 112C.

The intra prediction unit 112 is configured to generate a prediction signal through intra prediction (intra-frame prediction).

The intra prediction mode determination unit 112A is configured to determine information to be encoded by the intra prediction mode encoding unit 112B in the subsequent stage, such as an intra prediction mode of a corresponding block and whether or not the BDPCM is applied. Since a known method can be used as the determination method, a details thereof will be omitted.

The intra prediction mode encoding unit 112B is configured to encode the prediction mode of the target block. A processing content of the intra prediction mode encoding unit 112B is similar to that of the intra prediction mode decoding unit 242B. Specifically, for example, the intra prediction mode encoding unit 112B performs processing in which the "decoding" in the processing flowchart of the intra prediction mode decoding unit 242B illustrated in FIG. 6 is changed to "encoding".

The prediction signal generation unit 112C is configured to generate the prediction signal of the corresponding block according to the prediction mode encoded by the intra prediction mode encoding 112B. A method for generating the prediction signal is the same as that of the prediction signal generation unit 242C.

Further, the image encoding device 100 and the image decoding device 200 may be realized as a program causing a computer to execute each function (each step).

Note that the above described embodiments have been described by taking application of the present invention to the image encoding device 10 and the image decoding device 30 as examples. However, the present invention is not limited only thereto, but can be similarly applied to an encoding/decoding system having functions of the image encoding device 10 and the image decoding device 30.

According to the present invention, it is possible to provide an image decoding device, an image decoding method, and a program capable of ensuring that a particular block in a frame is lossless.

What is claimed is:

1. An image decoding device comprising a circuit, wherein the circuit:

corrects a value of a quantization parameter of a target block in accordance with whether or not an adaptive color transform has been applied to the target block;

sets the corrected value of the quantization parameter of the target block to be equal to or more than a minimum value of the quantization parameter at a time of applying a transform skip mode, in a case where a transform skip mode has been applied to the target block;

sets the minimum value of the quantization parameter to "4";

sets a quantization step width of "1" when the transform skip mode is applied to the target block; and sets the value of the quantization parameter of the target block to a larger value between the corrected value of the quantization parameter of the target block and "0", in a case where the transform skip mode has not been applied to the target block.

2. An image decoding method comprising:

in a case where a transform skip mode has been applied to a target block, correcting a value of a quantization parameter of the target block in accordance with whether or not an adaptive color transform has been applied to the target block;

setting the corrected value of the quantization parameter of the target block to be equal to or more than a minimum value of the quantization parameter at a time of applying a transform skip mode;

setting the minimum value of the quantization parameter to "4";

setting a quantization step width of "1" when the transform skip mode is applied to the target block; and setting the value of the quantization parameter of the target block to a larger value between the corrected value of the quantization parameter of the target block and "0", in a case where the transform skip mode has not been applied to the target block.

3. A program stored on a non-transitory computer-readable medium that causes a computer to perform:

in a case where a transform skip mode has been applied to a target block, correcting a value of a quantization parameter of the target block in accordance with whether or not an adaptive color transform has been applied to the target block;

setting the corrected value of the quantization parameter of the target block to be equal to or more than a minimum value of the quantization parameter at a time of applying a transform skip mode;

setting the minimum value of the quantization parameter to "4";

setting a quantization step width of "1" when the transform skip mode is applied to the target block; and setting the value of the quantization parameter of the target block to a larger value between the corrected value of the quantization parameter of the target block and "0", in a case where the transform skip mode has not been applied to the target block.

* * * * *